(12) United States Patent
Kondo et al.

(10) Patent No.: US 8,258,060 B2
(45) Date of Patent: Sep. 4, 2012

(54) SHEET STRUCTURE, SEMICONDUCTOR DEVICE AND METHOD OF GROWING CARBON STRUCTURE

(75) Inventors: Daiyu Kondo, Kawasaki (JP); Taisuke Iwai, Kawasaki (JP); Yoshitaka Yamaguchi, Kawasaki (JP); Ikuo Soga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 160 days.

(21) Appl. No.: 12/856,031

(22) Filed: Aug. 13, 2010

(65) Prior Publication Data
US 2010/0327444 A1 Dec. 30, 2010

Related U.S. Application Data

(63) Continuation of application No. PCT/JP2008/053635, filed on Feb. 29, 2008.

(51) Int. Cl.
*H01L 21/44* (2006.01)
(52) U.S. Cl. ... 438/680; 438/681; 438/903; 257/E21.17; 977/843; 977/845; 977/890
(58) Field of Classification Search ............ 438/680, 438/681, 903, FOR. 248; 257/E21.17; 977/843, 977/845, 890
See application file for complete search history.

(56) References Cited

U.S. PATENT DOCUMENTS

| | | |
|---|---|---|
| 5,863,601 A | 1/1999 | Kikuchi et al. |
| 7,094,679 B1 | 8/2006 | Li et al. |
| 7,217,650 B1 | 5/2007 | Ng et al. |
| 2004/0182600 A1 | 9/2004 | Kawabata et al. |
| 2005/0079120 A1 | 4/2005 | Fujita et al. |
| 2005/0099111 A1 | 5/2005 | Hirakawa et al. |
| 2005/0215049 A1 | 9/2005 | Horibe et al. |
| 2005/0224220 A1 | 10/2005 | Li et al. |
| 2006/0035085 A1 | 2/2006 | Ozaki et al. |
| 2006/0108906 A1 | 5/2006 | Gosain et al. |
| 2006/0231970 A1 | 10/2006 | Huang et al. |
| 2006/0286851 A1 | 12/2006 | Sato |
| 2007/0259186 A1 | 11/2007 | Ozaki et al. |
| 2008/0206616 A1* | 8/2008 | Atanassova et al. ............ 429/30 |
| 2008/0280169 A1* | 11/2008 | Niu et al. ........................ 429/13 |

(Continued)

FOREIGN PATENT DOCUMENTS

JP 9-031757 A 2/1997

(Continued)

OTHER PUBLICATIONS

Kusunoki, Michiko et al., "Patterned Carbon Nanotube Films Formed by Surface Decomposition of SiC Wafers", Japan Journal of Applied Physics, Dec. 2003, pp. L1486-L1488, vol. 42 Part 2 No. 12A.

(Continued)

*Primary Examiner* — Thanh V Pham
(74) *Attorney, Agent, or Firm* — Westerman, Hattori, Daniels & Adrian, LLP

(57) ABSTRACT

The sheet structure includes a plurality of linear structure bundles including a plurality of linear structures of carbon atoms arranged at a first gap, and arranged at a second gap larger than the first gap, a graphite layer formed in a region between the plurality of linear structure bundles and connected to the plurality of linear structure bundles, and a filling layer filled in the first gap and the second gap and retaining the plurality of linear structure bundles and the graphite layer.

12 Claims, 19 Drawing Sheets

U.S. PATENT DOCUMENTS

2009/0011204 A1* 1/2009 Wang et al. .................. 428/215

FOREIGN PATENT DOCUMENTS

| | | |
|---|---|---|
| JP | 2003-238123 A | 8/2003 |
| JP | 2003-273112 A | 9/2003 |
| JP | 2004-107118 A | 4/2004 |
| JP | 2004-262666 A | 9/2004 |
| JP | 2004-288833 A | 10/2004 |
| JP | 2005-150362 A | 6/2005 |
| JP | 2005-285821 A | 10/2005 |
| JP | 2006-147801 A | 6/2006 |
| JP | 2006-295120 A | 10/2006 |
| JP | 2006-297549 A | 11/2006 |
| JP | 2006-303240 A | 11/2006 |
| JP | 2006-339552 A | 12/2006 |
| JP | 2007-009213 A | 1/2007 |
| JP | 2007-532335 A | 11/2007 |
| WO | 2005/019132 A1 | 3/2005 |

OTHER PUBLICATIONS

Nihei, Mizuhisa et al., "Electrical Properties of Carbon Nanotube Bundles for Future Via Interconnects", Japanese Journal of Applied Physics, Apr. 2005, pp. 1626-1628, vol. 44 No. 4A.

International Search Report of PCT/JP2008/053635, Mailing Date of Jun. 10, 2008.

* cited by examiner

SHEET STRUCTURE, SEMICONDUCTOR DEVICE AND METHOD OF GROWING CARBON STRUCTURE

CROSS REFERENCE TO RELATED APPLICATIONS

This application is a Continuation of International Application No. PCT/JP2008/053635, with an international filing date of Feb. 29, 2008, which designating the United States of America, the entire contents of which are incorporated herein by reference.

FIELD

The embodiments discussed herein are related to a sheet structure including a linear structure of carbon atoms, a semiconductor device, and a method of growing a carbon structure.

BACKGROUND

The electronic parts used in the CPUs (Central Processing Units), etc. of servers and personal computers, etc. have the structure that a heat spreader of a material of high thermal conductivity, such as copper or others, is arranged with a thermal conductive sheet of an indium sheet or others provided immediately on the semiconductor element so as to efficiently radiate the heat generated by the semiconductor element.

However, the recent large demand increase of rare metal has raised the price of indium, and substitute materials which are less expensive than indium are expected. In terms of physical properties, the thermal conductivity of indium (50 W/m·K) cannot be said to be high. For more efficient radiation of the heat generated by the semiconductor element, materials of higher thermal conductivities are expected.

In such background, as a material having a thermal conductivity higher than indium, a linear structure of carbon atoms represented by carbon nanotube is noted. Carbon nanotube has not only a very high thermal conductivity (1500 W/m·K) but also good flexibility and electric conductivity. Carbon nanotube has high potential as a radiation material.

As a thermal conduction sheet, a thermal conductive sheet having carbon nanotubes distributed in a resin is disclosed in, e.g., Japanese Laid-open Patent Publication No. 2005-150362. A thermal conductive sheet having carbon nanotube bundles grown oriented on a substrate and buried in a resin is disclosed in, e.g., Japanese Laid-open Patent Publication No. 2006-147801.

Carbon nanotube is noted as an interconnection material to be used in semiconductor devices, etc. The copper interconnection presently dominantly used in integrated circuit devices has many explicit problems of reliability degradation, etc. due to electromigration as the devices are increasingly downsized. Then, carbon nanotube, which has good properties, such as good electric conductivity, permissible current density, which is about 1000 times higher than that of copper, ballistic electron transportation property, etc., is expected as a next generation interconnection material.

As an interconnection using carbon nanotube, proposals of vertical nanotube interconnections using vias are made (refer to, e.g., M. Nihel et al., "Electric properties of carbon nanotube bundles for future via interconnects," Japanese Journal of Applied Physics, Vol. 44, No. 4A, 2005, pp. 1626-1628.

The following are examples of related: Japanese Laid-open Patent Publication No. 2006-303240; Japanese Laid-open Patent Publication No. 09-031757; Japanese Laid-open Patent Publication No. 2004-262666; Japanese Laid-open Patent Publication No. 2005-285821; Japanese Laid-open Patent Publication No. 2006-297549; Japanese Laid-open Patent Publication No. 2006-339552; and Japanese Laid-open Patent Publication No. 2003-238123.

The thermal conductive sheet disclosed in Japanese Laid-open Patent Publication No. 2005-150362 has carbon nanotubes simply distributed in a resin, and thermal resistances are generated at the joints between the distributed carbon nanotubes. Carbon nanotube has the characteristic that the thermal conductivity along the direction of orientation of carbon nanotube is minimum, but the thermal conductive sheet disclosed in Japanese Laid-open Patent Publication No. 2005-150362, in which the orientation direction of the carbon nanotubes is disuniform, has failed to make the best use of the high thermal conductivity of the carbon nanotube. In this point, the thermal conductive sheet disclosed in Japanese Laid-open Patent Publication No. 2006-147801 has carbon nanotube bundles grown oriented on a substrate, and can realize higher thermal conductivity than the thermal conduction sheet disclosed in Japanese Laid-open Patent Publication No. 2005-150362.

However, the inventors of the present application examined the thermal conductive sheet disclosed in Japanese Laid-open Patent Publication No. 2006-147801 and have found that aggregations and biases take place between carbon nanotube bundles when a resin is filled between the carbon nanotubes with a result that the orientation and the uniformity of the carbon nanotubes are impaired, and the thermal conductivity cannot be realized as expected. In this structure, the radiation in the vertical direction (the direction perpendicular to the surface of the sheet) can be ensured to some extent, but it is difficult to ensure the radiation in the horizontal direction (the direction parallel to the surface of the sheet). That is, the thermal conductivity of the resin as a whole is about 1 (W/m·K) and is lower by about 3 places in comparison with the vertical thermal conductivity of carbon nanotube. The radiation effect in the horizontal direction is very low.

Preferably, the interconnection material can form not only interconnection structures connected in the vertical direction as disclosed in M. Nihel et al. but also interconnection structures connected in the horizontal direction. However, the horizontal interconnection using carbon nanotube has not been realized yet because there are many difficulties in controlling the horizontal growth of the nanotube, and additionally, it is difficult in terms of the process to form electrode blocks interconnecting the via interconnections and the horizontal interconnections, which are the starts of the horizontal interconnections.

SUMMARY

According to one aspect of an embodiment, there is provided a sheet structure including a plurality of linear structure bundles including a plurality of linear structures of carbon atoms arranged at a first gap, and arranged at a second gap larger than the first gap, a graphite layer formed in a region between the plurality of linear structure bundles and connected to the plurality of linear structure bundles, and a filling layer filled in the first gap and the second gap and retaining the plurality of linear structure bundles and the graphite layer.

According to another aspect of an embodiment, there is provided a semiconductor device including a first interconnection layer formed over a semiconductor substrate, a via interconnection formed of a linear structure bundle including a plurality of linear structures of carbon atoms, and connected to the first interconnection layer, an insulating film formed over the semiconductor substrate in a region except a region where the via interconnection is formed, coating the first interconnection layer, and a second interconnection layer including a graphite layer formed on the via interconnection and on the insulating film.

According to further another aspect of an embodiment, there is provided a method of growing a carbon structure including forming a first catalytic metal film over a substrate in a first region, forming a second catalytic metal film different from the first catalytic metal film over the substrate in a second region adjacent to the first region, forming selectively in the first region a first carbon structure including a plurality of linear structures of carbon atoms with the first catalytic metal film as a catalyst, and forming selectively in the second region a second carbon structure including a graphite layer with the second catalytic metal film as a catalyst.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

A carbon nanotube sheet and a method of manufacturing the same according to a first embodiment will be described with reference to FIGS. 1A to 5C.

Figure 1A:
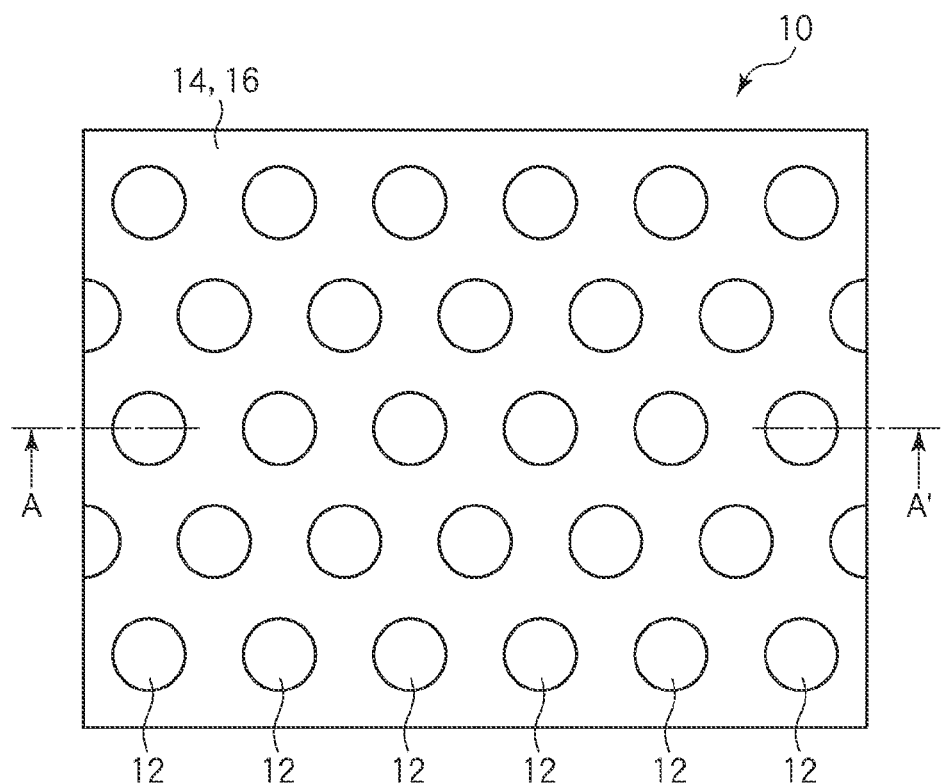
FIG. 1A is a plan view illustrating a structure of a carbon nanotube sheet according to a first embodiment.
Figure 1B:
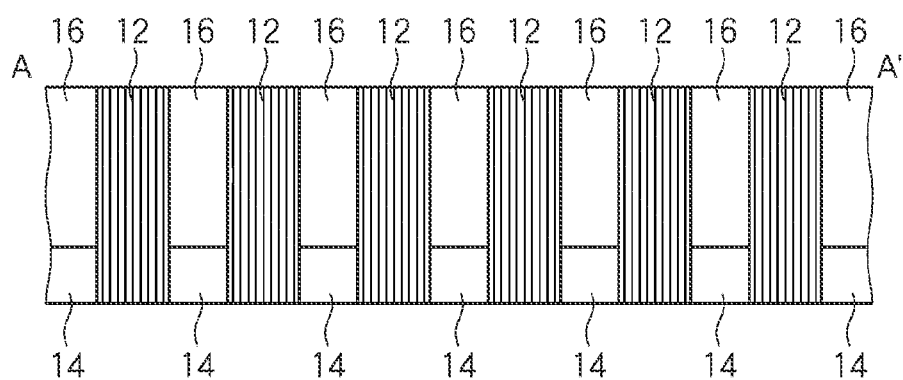
FIG. 1B is a diagrammatic cross-sectional view illustrating a structure of a carbon nanotube sheet according to a first embodiment.
Figure 2A:
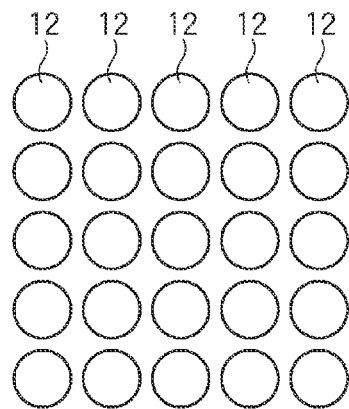
FIGS. 2A-2E are plan views illustrating configurations of carbon nanotube bundles of the carbon nanotube sheet according to the first embodiment.
Figure 2B:
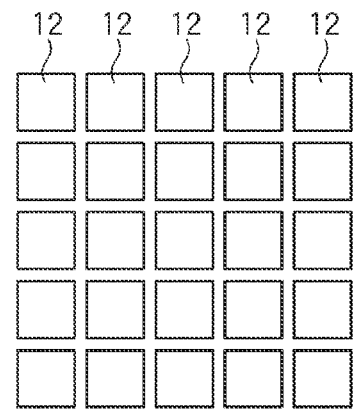
Figure 2C:
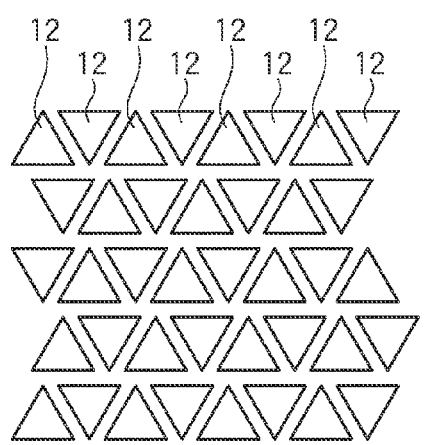
Figure 2D:
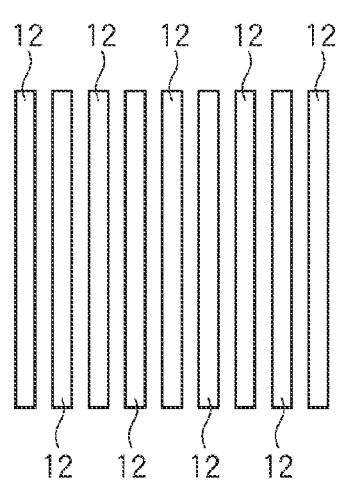
Figure 2E:
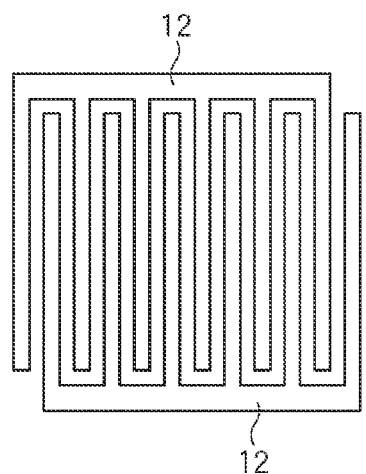
Figure 3A:
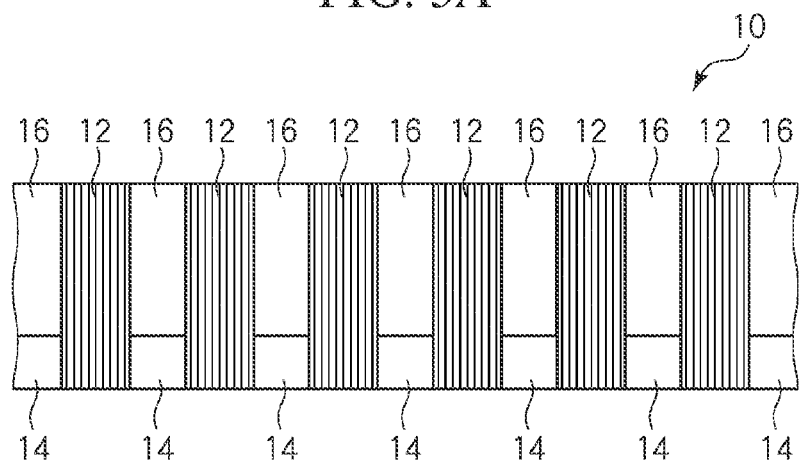
FIGS. 3A-3C are diagrammatic cross-sectional views illustrating the structures of the carbon nanotube sheet according to the first embodiment.
Figure 3B:
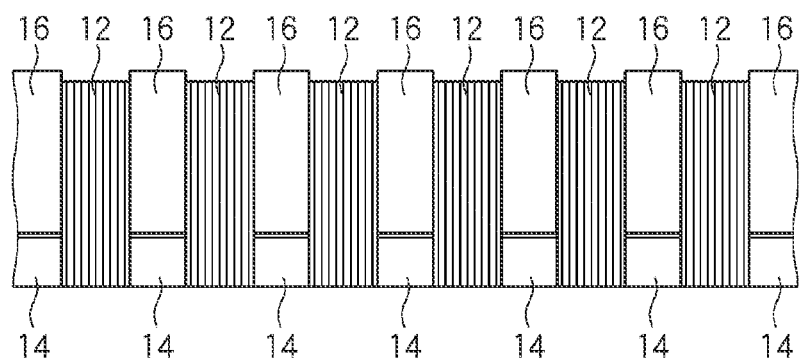
Figure 3C:
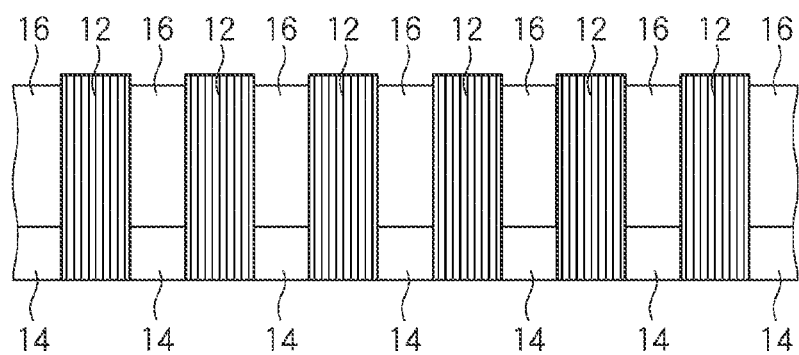

FIG. 1A is a plan view illustrating a structure of a carbon nanotube sheet according to the present embodiment. FIG. 1B is a diagrammatic cross-sectional view illustrating a structure of a carbon nanotube sheet according to the present embodiment. FIGS. 2A-2E are plan views illustrating configurations of carbon nanotube bundles of the carbon nanotube sheet according to the present embodiment. FIGS. 3A-3C are diagrammatic cross-sectional views illustrating the structures of the carbon nanotube sheet according to the present embodiment. FIGS. 4A-5C are cross-sectional views illustrating the method of manufacturing the carbon nanotube sheet according to the present embodiment.

First, the structure of the carbon nanotube sheet according to the present embodiment will be described with reference to FIGS. 1A and 1B. FIGS. 1A and 1B are respectively a plan view and a cross-sectional view illustrating the structure of the carbon nanotube sheet according to the present embodiment.

The carbon nanotube sheet (the sheet structure) according to the present embodiment includes a plurality of carbon nanotube bundles (linear structure bundles) 12 arranged spaced from each other (see FIG. 1A). In the gap between the carbon nanotube bundles 12, a graphite layer 14 formed on one surface side of the sheet, and a filling layer 16 of a resinous material, etc are formed (see FIGS. 1A and 1B). The filling layer 16 is also filled in the gaps in the carbon nanotube bundles 12 and the graphite layer 14. The graphite layer 14 is thermally and electrically connected to the carbon nanotube bundles 12.

The respective carbon nanotube bundles 12 are formed, extended vertical to the surface of the sheet and include a plurality of carbon nanotubes (linear structures of carbon atoms) oriented vertical to the surface of the sheet.

The carbon nanotube may be either of a single-walled carbon nanotube or a multi-walled carbon nanotube. The density of the carbon nanotubes contained in the carbon nanotube bundles 12 is preferably $1 \times 10^{10}$ tubes/cm$^2$ or more in view of the radiation and the electric conduction. The length of the carbon nanotube bundles 12 (the thickness of the sheet) is determined by an application of the carbon nanotube sheet 10 and is not specifically defined but can be set preferably at a value of about 5 μm-500 μm.

In the carbon nanotube sheet 10 according to the present embodiment, a gap is provided between the carbon nanotube bundles 12, and the filling layer 16 is formed in the gap. This is for, in forming the filling layer 16 between the carbon nanotubes, improving the permeation of the filling material and suppressing configuration changes, such as horizontal falls, etc. of the carbon nanotubes, so as to maintain the original orientation of the carbon nanotubes (refer to the manufacturing method to be described later).

The space of the region where each carbon nanotube bundle 12 is formed is not specifically limited, but for, e.g., the round region, the diameter can be set at, e.g., 10 μm-1000 mm.

The gap necessary between the carbon nanotube bundles 12 varies depending on a viscosity of the filling material to be the filling layer 16 and cannot be unconditionally determined but can be set at a width sufficiently larger than a gap between the carbon nanotubes forming each carbon nanotube bundle 12, preferably at a value of about 0.1 μm-200 μm. However, as the gap between the carbon nanotube bundles 12 is larger, the surface density of the carbon nanotubes in the sheet surface decreases, that is, the thermal conductivity for the sheet decreases. The surface density of the carbon nanotubes in the sheet surface varies also depending on a size of the carbon nanotube bundles 12. Accordingly, the gap between the carbon nanotube bundles may be suitably set corresponding to a thermal conductivity necessary for the sheet and also in consideration of a size of the carbon nanotube bundles 12.

The plane shape of each carbon nanotube bundle is not limited to the circle illustrated in FIG. 1A and can be, other than a circle, a polygon, e.g., a triangle, a quadrangle, a hexagon or others.

The layout of a plurality of the carbon nanotube bundles 12 is not limited to the close-packed arrangement of circle as shown in FIG. 1A. For example, as illustrated in FIGS. 2A and 2B, the carbon nanotube bundles 12 may be positioned respectively at the lattice points of a square lattice. As illustrated in FIG. 2C, the carbon nanotube bundles 12 of a triangular plane shape may be arranged in row, positioned alternately up-side-down. As illustrated in FIG. 2D, the carbon nanotube bundles 12 may be stripe-patterned. As illustrated in FIG. 2E, the carbon nanotube bundles 12 may be comb-like patterned.

The graphite layer 14 is formed of graphite of the layer structure parallel with the surface of the sheet and is formed connected to the side surfaces of the carbon nanotube bundles 12. The thickness of the graphite layer 14 is, e.g., about several nms-hundreds nms.

The material forming the filling layer 16 is not specifically limited as long as the material has liquid properties in burying the carbon nanotubes and then can be cured. For example, as an organic filling material, acryl resin, epoxy regin, silicone resin, polyimide resin or others can be used. As an inorganic filling material, a composition for forming insulating film by coating, such as SOG (Spin On Glass) or others, or others can be used. A metal material, such as indium, solder, a metal paste (e.g., silver paste) or others can be also used. A conductive polymer, e.g., polyaniline, polythiophene or others, can be also used.

An additive may be mixed in the filling layer 16 as required. As an additive, a material of high thermal conductivity or a material of high electric conductivity are considered. An additive of high thermal conductivity is mixed in the filling layer 16, whereby the thermal conductivity of the filling layer 16 can be improved, which can improve the thermal conductivity of the carbon nanotube sheet as a whole. When the carbon nanotube sheet is used as an electric conductive sheet, an additive of high electric conductivity is mixed in the filling layer 16, whereby the electric conductivity of the filling layer 16 can be improved, which can improve the electric conductivity of the carbon nanotube sheet as a whole. The additive is especially effective when an insulating material of low thermal conductivity, e.g., an organic filling material or others, is used as the filling layer 16. As a material of high thermal conductivity, carbon nanotube, a metal material, aluminum nitride, silica, alumina, graphite, fullerene or others can be used. As a material of high electric conductivity, carbon nanotube, a metal material or others can be used.

As described above, the carbon nanotube sheet 10 according to the present embodiment includes the carbon nanotube bundles 12 oriented vertical to the surface of the sheet, and the graphite layer 14 of graphite of the layer structure parallel with the surface of the sheet. The carbon nanotube has a very high thermal conductivity of about 1500 (W/m·K) in the direction of the orientation. The graphite has a thermal conductivity which is not so high as the thermal conductivity of the carbon nanotube, but the thermal conductivity in the direction parallel to the layer surface (a-axis) is as high as about 500 (W/m·K).

Accordingly, as in the present embodiment, the carbon nanotube sheet 10 comprises the combination of the carbon nanotube bundles 12 and the graphite layer 14, whereby the thermal conductivity in the direction vertical to the surface of the sheet is ensured by the carbon nanotube (the carbon nanotube bundles 12), and the thermal conductivity in the direction parallel to the surface of the sheet can be ensured by the graphite (the graphite layer 14).

The thermal conductivity of graphite is 500 times or more the thermal conductivity of resinous materials (about 1 (W/m·K)). Accordingly, the presence of the graphite layer 14 can drastically improve the radiation in the direction parallel to the surface of the sheet by 500 times or more in comparison with the radiation without the graphite layer 14.

The carbon nanotube sheet 10 according to the present embodiment has the upper ends and lower ends of the carbon nanotube bundles 12 not covered by the filling layer 16. Accordingly, when the carbon nanotube sheet 10 comes into contact with a radiator or an exothermic body, the carbon nanotube bundles 12 in direct contact with the radiator or the exothermic body can drastically improve the thermal conductivity.

Carbon nanotube and graphite have also high conductivity, and the carbon nanotube bundles 12, which have the upper ends and lower ends exposed, can be used as interconnections passed through the sheet. The graphite layer 14 can be used also as interconnections parallel to the surface of the sheet. That is, the carbon nanotube sheet 10 according to the present embodiment can be used not only as a thermal conductive sheet but also as an interconnection sheet.

The relationship between the height of the carbon nanotube bundles 12 and the thickness of the filling layer 16 (both are sheet thickness-wise lengths) can be that both are equal to each other as illustrated in FIG. 3A, that one ends of the carbon nanotube bundles can be dented with respect to the surface of the filling layer 16 as illustrated in FIG. 3B, or that one ends of the carbon nanotubes 12 are projected with respect to the surface of the filling layer 16. Such configurations can be discriminately formed by changing the material and processing conditions of the filling layer 16 (see the manufacturing method to be descried later).

The configuration illustrated in FIG. 3B is expected to mitigate the stresses to be applied to the carbon nanotube bundles 12 by the filling layer 16 when the carbon nanotube sheet 10 is arranged between a radiator and an exothermic body. On the other hand, the configuration illustrated in FIG. 3C is expected to improve the adhesion of the carbon nanotube bundles 12 to the radiator and the exothermic body and improve the thermal conductivity. Preferably, the relationship between the height of the carbon nanotube bundles 12 and the thickness of the filling layer 16 are set suitably depending on applications of the carbon nanotube sheet 10, stresses to be applied to the sheet, etc.

Next, the method of manufacturing the carbon nanotube sheet according to the present embodiment will be described with reference to FIGS. 4 and 5.

First, a substrate 30 to be used as a base for the carbon nanotube sheet 10 to be formed on is prepared. As the substrate 30, a semiconductor substrate, such as a silicon substrate, an insulating substrate, such as an alumina (sapphire)

substrate, an MgO substrate, a glass substrate or others, can be used. The substrate 30 may be such substrate with a thin film formed on. For example, silicon substrate with an about 300 nm-thickness silicon oxide film formed on can be used.

The substrate 30 is to be removed after the carbon nanotube sheet 10 is formed. For this purpose, it is preferable that the substrate 30 has at least the surface to be contacted to the carbon nanotube sheet 10 formed of a material which is easy to be released from the carbon nanotube sheet 10 or a material which can be etched selectively with respect to the carbon nanotube sheet 10.

For example, when the filling layer 16 is formed of acryl resin, a material whose adhesiveness to acryl resin is weak, e.g., silicon oxide film, silicon nitride film or others, is formed on the surface of the substrate 30, whereby the carbon nanotube sheet 10 can be easily released. Otherwise, the surface of the substrate 30 is formed of a material which can be etched selectively with respect to the carbon nanotube sheet 10, e.g., silicon oxide film, silicon nitride film or others, whereby the film is etched off to thereby release the carbon nanotube sheet 10 from the substrate 30.

Figure 4A:
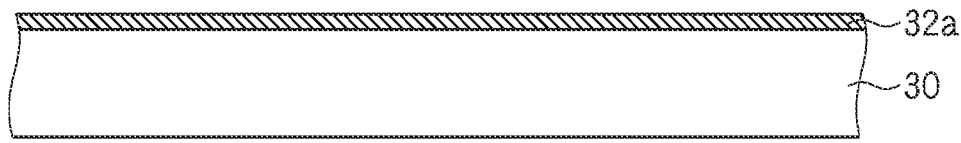
FIGS. 4A-4C and 5A-5C are cross-sectional views illustrating a method of manufacturing the carbon nanotube sheet according to the first embodiment.

Then, over the substrate 30, an about 0.3 nm-10 nm, e.g., a 2.5 nm-thickness Fe (iron) film is formed by, e.g., sputtering method to thereby form a catalytic metal film 32a of Fe (FIG. 4A). The catalytic metal film 32a may be formed by electron beam evaporation method, MBE method or others.

The catalytic metal can be, other than Fe, Co (cobalt), Ni (nickel), Au (gold), Ag (silver), Pt (platinum) or an alloy containing at least one of these metals. As the catalyst, other than metal film, metal particulates of a beforehand controlled size prepared by a DMA (differential mobility analyzer) or others may be used. In this case as well, the metal species can be the same as the species for the thin film.

As a base film of the catalytic metal, a film of Mo (molybdenum), Ti (titanium), Hf (hafnium), Zr (zirconium), Nb (niobium), V (vanadium), TaN (tantalum nitride), $TiSi_x$ (titanium silicide), Al (aluminum), $Al_2O_3$ (aluminum oxide), $TiO_x$ (titanium oxide), Ta (tantalum), W (tungsten), Cu (copper), Au (gold), Pt (platinum), Pd (palladium), TiN (titanium nitride) or others, or a film of an alloy containing at least one of them may be formed. For example, the layer structure of Fe (2.5 nm)/Al (10 nm), the layer structure of Co (2.6 nm)/TiN (5 nm), or others can be also used. When the metal particulates are used, the layer structure of, e.g., Co (the average diameter: 3.8 nm)/TiN (5 nm) or others can be used.

Next, over the catalytic metal film 32a, a photoresist film 34 is formed by spin coating method.

Next, in the photoresist film 34, openings 36 covering the regions for the carbon nanotube bundles 12 to be formed on and exposing the region for the graphite layer 14 to be formed on are formed. As the pattern of the openings 36, the pattern exemplified in FIG. 1A is used, the diameter of the openings 36 (the diameter of the regions for the carbon nanotube bundles 12 to be formed in) is 100 μm, and the gap between the openings 36 (between the carbon nanotube bundles 12) is 20 μm. As the pattern of the openings 36 to be formed in the photoresist film 34, other than the pattern exemplified in FIG. 1A, various patterns as illustrated in FIGS. 3A to 3E can be used.

Figure 4B:
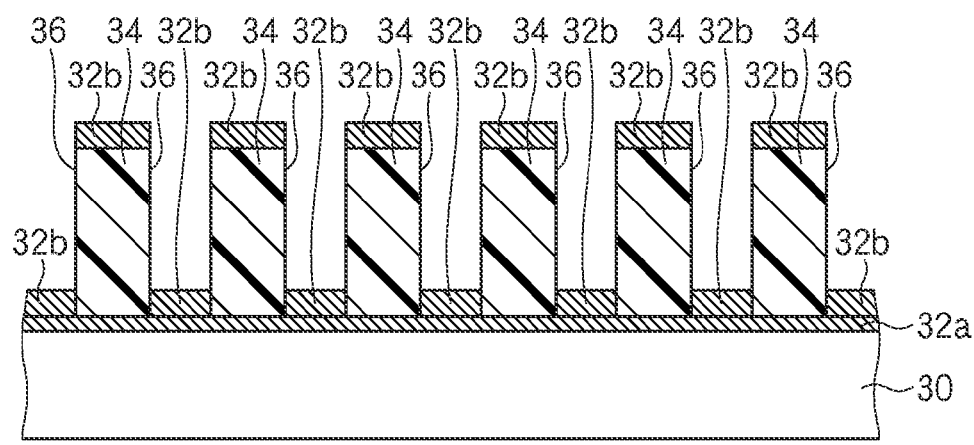

Then, an Fe (iron) film of an about 10-200 nm-thickness, e.g., a 97.5 nm film thickness is formed by e.g., sputtering method to form the catalytic metal film 32b of Fe. The catalytic meal film 32b is formed over the photoresist film 34 and the catalytic metal film 32a in the openings 36a (FIG. 4B). As the constituent material of the catalytic metal film 32b, the same catalytic metal material of the catalytic metal film 32a is used. The catalytic metal film 32b may be formed by electron beam evaporation method, MBE method or others.

Figure 4C:
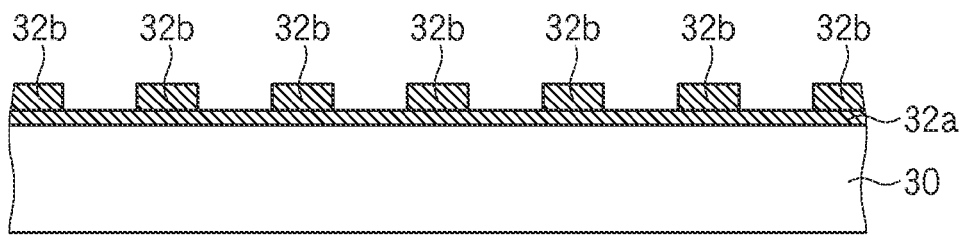

Next, the catalytic metal film 32b is lifted off together with the photoresist film 34 to leave the catalytic metal film 32b selectively on the catalytic metal film 32a. Thus, the catalytic metal film 32a of a 2.5 nm-thickness Fe film in the regions for the carbon nanotube bundles 12 to be formed in, and in the regions for the graphite layer 14 to be formed in, the catalytic metal films 32a, 32b of a 100 nm-thickness Fe film is formed (FIG. 4C).

Next, by, e.g., hot filament CVD method and with the catalytic metal films 32a, 32b as the catalyst, carbon nanotubes and graphite are grown on the substrate respectively in the regions for the carbon nanotube bundles 12 to be formed in and in the regions for the graphite layer 14 to be formed in.

At this time, by suitably setting the film thicknesses and growth conditions of the catalytic metal films 32a, 32b, the carbon nanotubes and the graphite can be simultaneously grown.

In the regions where the catalytic metal film is thin (the regions for the carbon nanotube bundles to be formed in), the catalytic metal is aggregated into particulates at a temperature of the growth. The growth advances with the catalytic metal particles as the cores, and the carbon nanotubes are formed. On the other hand, in the regions where the catalytic metal film is thick (the regions for the graphite layer 14 to be formed in), the catalytic metal does not aggregate at the temperature of the growth and remains in the films. Thus, with the catalytic metal films as the cores, the growth advances flat, and the graphite is formed.

Thus, in the regions for the carbon nanotube bundles to be formed in, the metal film of a film thickness which allows the catalytic metal to aggregate at the temperature of the growth is formed, and in the regions for the graphite layer to be formed in, the catalytic metal film of a film thickness which does not allow the catalytic metal to aggregate at the temperature of the growth.

In the above-described example, that the catalyst metal film of a 2.5 nm-thickness Fe film is formed in the regions for the carbon nanotube bundles 12 to e formed in, and the catalyst metal films 32a, 32b of a 100 nm-thickness Fe film is formed in the region for the graphite layer 14 to be formed in, by using the mixed gas of acetylene and argon (the partial pressure ratio of 1:9), and setting the total gas pressure in the film forming chamber at 1 kPa, 620° C. temperature and the growth period of time at 20 minutes, multi-walled carbon nanotubes of a wall number of 3-6 walls (about 4 walls on average), a 4-8 nm (6 nm on average)-diameter, a 100 μm-length and an about $1 \times 10^{11}$ tubes/$cm^2$-density could be grown, and in the region for the graphite layer 14 to be formed in, graphite of a 13 nm-thickness could be grown.

In the example using the above-described growth conditions, the relationships between the film thickness of the Fe film as the catalytic metal film and the growths were examined, and the result is as follows. When the film thickness of the catalytic metal film is less than 10 nm, the carbon nanotubes were grown. When the film thickness of the catalytic metal film is not less than 10 nm and less than 20 nm, both the carbon nanotubes and the graphite were grown. When the film thickness of the catalytic metal film is 20-1000 nm, the graphite was grown.

The catalytic metal more easily forms into particulates as the temperature is higher. The conditions for forming the particulates differ depending on species of the catalytic metal. Accordingly it is preferable to suitably adjust the film thickness of the catalytic metal film depending on species of the catalytic metal, the growth temperature, etc.

The carbon nanotubes and the graphite may be formed by another film forming process, such as thermal CVD method or others. The carbon nanotubes to be grown may be single-walled carbon nanotubes. As the carbon raw material, a hydrocarbon other than acetylene, such as methane, ethylene or others, an alcohol, such as ethanol, methanol or others, or others may be used.

Figure 5A:
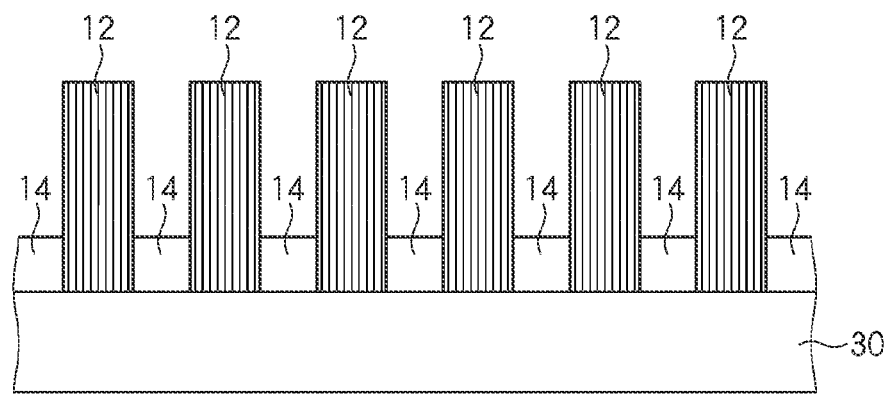

Thus, over the substrate 30, carbon nanotube bundles including a plurality of carbon nanotubes oriented in the normal direction of the substrate 30 (vertically), and the graphite layer 14 of graphite of the layer structure parallel with the surface of the sheet (FIG. 5A).

Then, a filling material to be the filling layer 16 is coated by, e.g., spin coating method. At this time, the viscosity of the coating solution and the rotation number of the spin coater are suitably set so that the filling material cannot cover the carbon nanotube bundles 12.

For example, when acryl resin is used as the filling material, the height of the carbon nanotube bundles 12 and the thickness of the filling layer 16 can be made substantially equal to each other by coating acryl resin of, e.g., a 440 mPa·s viscosity under the conditions of 2000 rpm and 20 seconds.

The thickness of the filling layer 16 is made smaller than the height of the carbon nanotube bundles 12 by coating acryl resin of, e.g., a 440 mPa·s viscosity under the conditions of 4000 rpm and 20 seconds and otherwise by coating acryl resin diluted to 80 w % with MEK (methyl ethyl ketone) solution under the conditions of 2000 rpm and 20 seconds.

It is possible to coat the filling material covering the carbon nanotube bundles 12 and then expose the upper surfaces of the carbon nanotube bundles 12 by plasma asking method, annealing method with oxygen or others.

A metal thin film may be deposited over the carbon nanotube bundles 12 and the graphite layer 14 before the filling material is coated. As the metal thin film, gold (Au) of, e.g., a 300 nm-thickness may be deposited. The metal thin film is deposited over the carbon nanotube bundles, whereby the thermal resistance and the electric resistance between the carbon nanotubes can be decreased, and the eradiation of the carbon nanotube sheet can be further improved.

The filling material is not specifically limited as long as the filling material exhibits liquid properties and then can be cured. For example, as an organic filling material, acryl resin, epoxy resin silicone resin, polyimide or others can be used. As an inorganic filling material, a composition for forming insulating film by coating, such as SOG (Spin On Glass) or others, or others can be used. A metal material, such as indium, solder, a metal paste (e.g., silver paste) or others can be also used. A conductive polymer, e.g., polyaniline, polythiophene or others, can be also used.

In forming the filling layer 16, because of the gaps between the plural carbon nanotube bundles 12 formed over the substrate 30, the coating filling material spreads over the entire surface of the substrate 30 along the gaps. Then the filling material penetrates into the carbon nanotube bundles 12 and the graphite layer 14.

With carbon nanotubes formed over the entire surface of the substrate, when the filling material penetrates into the carbon nanotube bundles, individual carbon nanotubes adhere to one another, and the carbon nanotube bundles lose the original orientation and make configurational changes, such as horizontal falls.

However, gaps are provided between the carbon nanotube bundles 12 as in the present embodiment, whereby the filling material spreads over the entire surface of the substrate 30 and the penetrates into the carbon nanotube bundles 12, whereby the filling material filled in advance between the carbon nanotube bundles 12 acts as the supporter for retaining the configuration of the carbon nanotubes when the filling material penetrates into the carbon nanotube bundles, and the configurational changes of the carbon nanotube bundles 12 can be suppressed. Thus, the filling layer can be formed with the orientation of the carbon nanotube bundles 12 retained.

The gap necessary between the carbon nanotube bundles 12 varies depending on a species, viscosity, etc of the filling material and cannot be generally determined. However, the inventors of the present application examined and have confirmed that the gap of not less than 0.1 μm can prevent the configurational changes of the carbon nanotube bundles.

The filling layer 16 may be formed by immersing the substrate 30 in a solution of the filling material (the so-called dip method). In this case as well, the gap provided between the carbon nanotube bundles 12 can prevent the configurational changes of the carbon nanotube bundles.

Figure 5B:
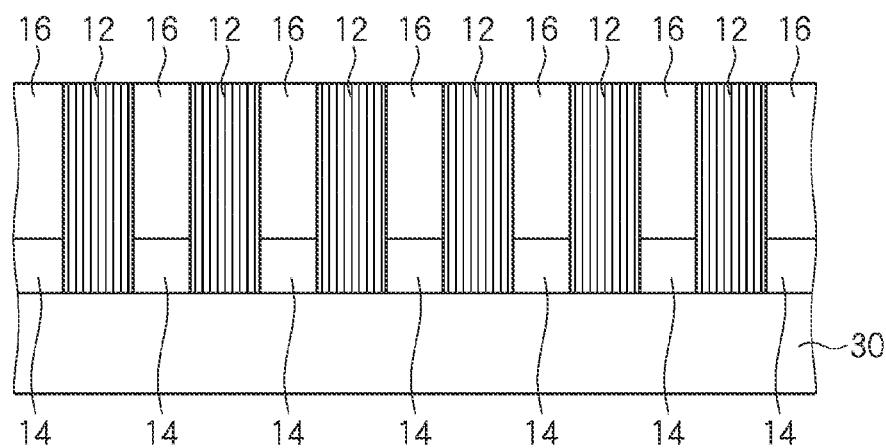

Next, the filling material is cured to form the filling layer 16 of the filling material (FIG. 5B). For example, when a photo-cure material, such as acryl resin or others, is used as the filling material, the filling material can be cured by photo irradiation. When a thermosetting material, such as epoxy resin, silicone resin or others, is used as the filling material, the filling material can be cured by heat processing. Epoxy resin can be thermoset by heat processing of, e.g., 150° C. and 1 hour. Silicone resin can be thermoset by heat processing of, e.g., 200° C. and 1 hour.

After the filling layer 16 has been cured, when the upper ends of the carbon nanotube bundles 12 are not sufficiently exposed or are covered by the filling layer 16, the filling layer 16 over the carbon nanotube bundles 12 may be removed by CMP (chemical mechanical polishing), oxygen plasma asking, argon ion milling or others.

Figure 5C:
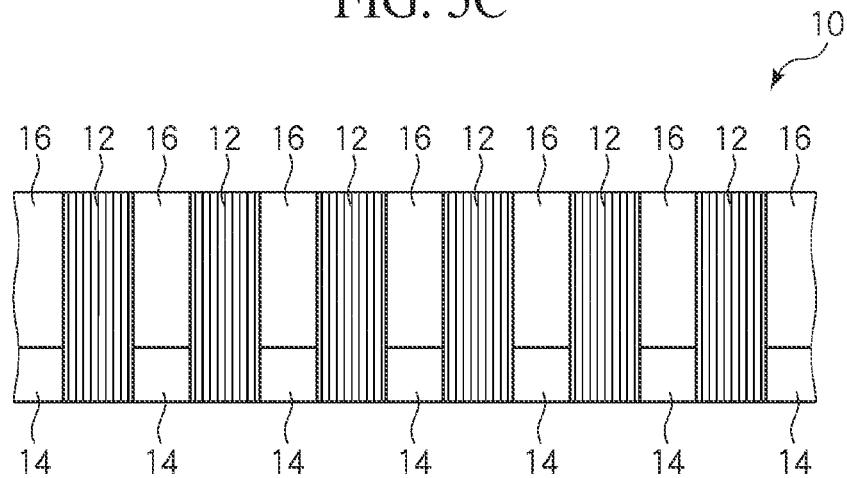

Then, the carbon nanotube bundles 12, the graphite layer 14 and the filling layer 16 are peeled from the substrate 30, and the carbon nanotube sheet 10 is obtained (FIG. 5C).

At this time, when the surface of the substrate is formed of a material which allows the carbon nanotube sheet 10 to be easily peeled from, e.g., when the surface of the substrate 30 is formed of silicon oxide film or silicon nitride film, and the filling layer is formed of acryl resin, the substrate 30 can be easily peeled form the carbon nanotube sheet 10.

Otherwise, when a layer which does not allow the carbon nanotube sheet 10 to be easily peeled from but can be etched selectively with respect to the carbon nanotube sheet 10 is formed on the surface of the substrate 30, e.g., silicon oxide film or silicon nitride film is formed on the surface of the substrate 30, the silicon oxide film or the silicon nitride film is removed by wet etching using a solution of hydrofluoric acid or hot phosphoric acid or others to thereby free the carbon nanotube sheet 10 from the substrate 30.

When the surface of the substrate 30 is formed of a material which neither allows the carbon nanotube sheet 10 to be easily peeled form nor can be selectively removed, e.g., the substrate 30 is a sapphire substrate, and the filling layer 16 is formed of silicone resin, a sharp cutter is inserted between the substrate 30 and the carbon nanotube sheet 10 to thereby peel the carbon nanotube sheet 10 from the substrate 30.

Before the peeling, the carbon nanotube bundles 12 and the graphite layer 14 are in direct contact with the substrate 30, and on the surface of the peeled carbon nanotube sheet on the side of the substrate, the carbon nanotube bundles 12 and the graphite layer 14 are exposed. Accordingly, in the carbon nanotube sheet 10 formed by the above-described manufacturing method, the carbon nanotube bundles 12 can be exposed on both surfaces of the sheet, and on one surface, the graphite layer 14 can be exposed. At the parts where the carbon nanotube bundles 12 and the graphite layer 14 are exposed, connections can be made with a metal such as In or others, a solder, a plating of, e.g., AuSn, a metal paste, or others.

The thermal resistance of the conventionally used indium sheet is 0.21 (° C./W) while the thermal resistance of the carbon nanotube sheet formed of only the carbon nanotubes formed by the above-described process is 0.13 (° C./W). The thermal conductivity difference is reflected on the thermal resistance difference, and based on this, it is evident that the carbon nanotube sheet according to the present embodiment, which includes in addition to the carbon nanotubes the exothermic graphite layer formed in parallel to the surface can more reduce the thermal resistance.

As described above, according to the present embodiment, a plurality of the carbon nanotube bundles are formed spaced from each other on a substrate, and the filling layer for retaining the carbon nanotube bundles is formed by filling the filling material, whereby configurational changes of the carbon nanotube bundles can be prevented in forming the filling layer. Thus, the carbon nanotube sheet including the carbon nanotube bundles oriented in the direction of the film thickness of the sheet can be easily formed. Both ends of the carbon nanotube bundles can be exposed out of the filling layer, whereby the thermal conductivity and the electric conductivity to a connected body can be improved.

In the gaps between the carbon nanotube bundles, the graphite layer is formed in connection with the carbon nanotube bundles, whereby the thermal conductivity and the electric conductivity in the direction parallel with the sheet surface can be improved.

The carbon nanotube bundles and the graphite layer can be simultaneously formed, which makes it possible to form the carbon nanotube sheet without largely changing the manufacturing steps. Thus, the manufacturing cost increase can be prevented.

A Second Embodiment

A carbon nanotube sheet and a method of manufacturing the same according to a second embodiment will be described with reference to FIGS. 6A to 9C. The same members of the present embodiment as those of the carbon nanotube sheet and the method of manufacturing the same according to the first embodiment illustrated in FIGS. 1A to 5C are represented by the same reference numbers not to repeat or to simplify their explanation.

Figure 6A:
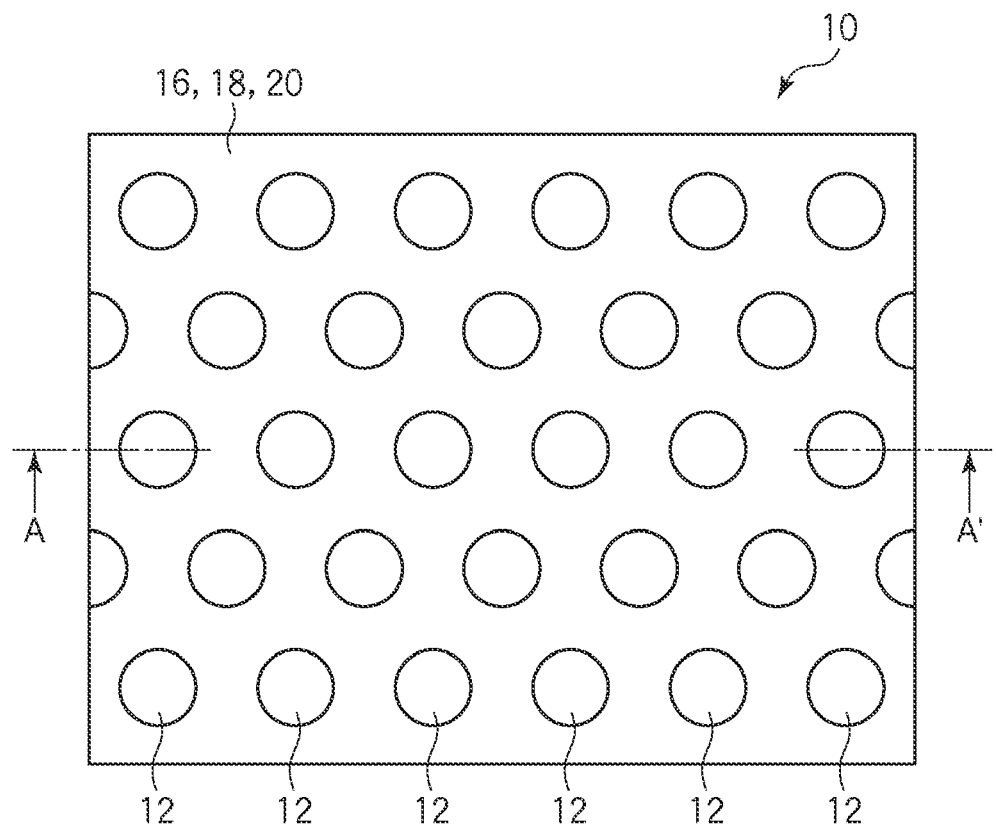
FIG. 6A is a plan view illustrating a structure of a carbon nanotube sheet according to a second embodiment.
Figure 6B:
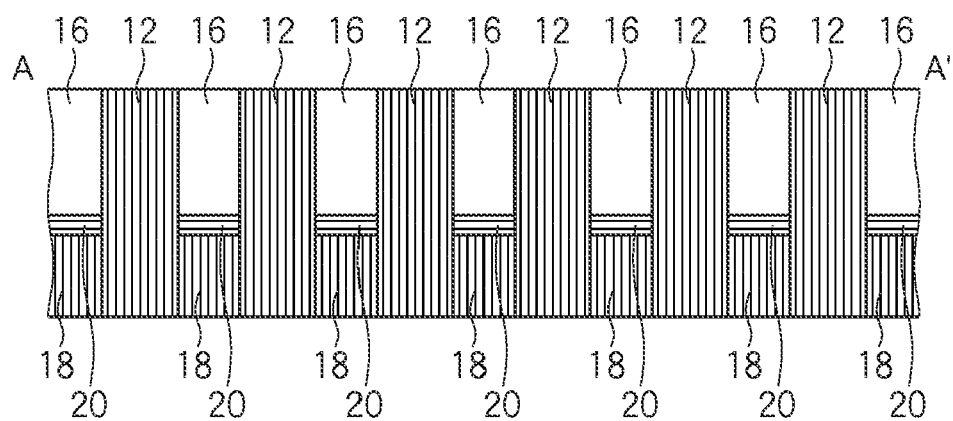
FIG. 6B is a diagrammatic cross-sectional view illustrating a structure of a carbon nanotube sheet according to a second embodiment.
Figure 7:
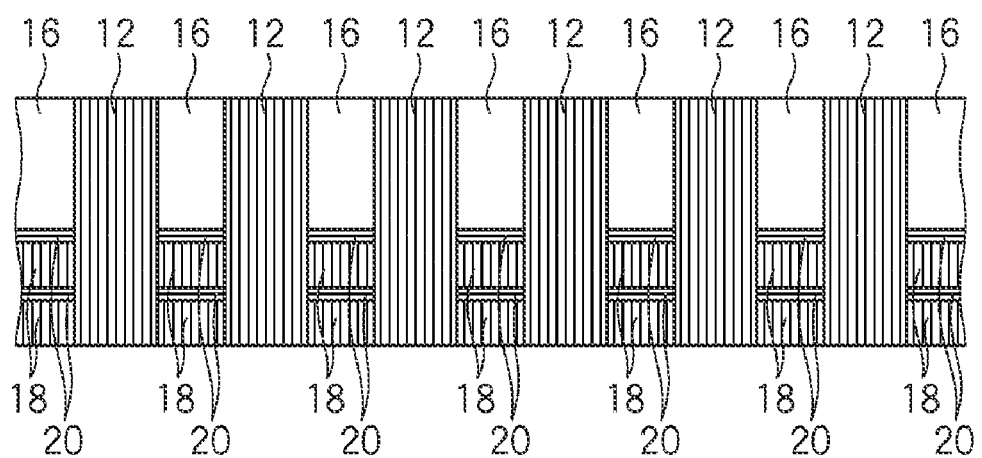
FIG. 7 is a diagrammatic cross-sectional view illustrating a structure of a carbon nanotube sheet according to a modification of the second embodiment.

FIG. 6A is a plan view illustrating a structure of a carbon nanotube sheet according to the present embodiment. FIG. 6B is a diagrammatic cross-sectional view illustrating a structure of a carbon nanotube sheet according to the present embodiment. FIG. 7 is a diagrammatic cross-sectional view illustrating a structure of a carbon nanotube sheet according to a modification of the present embodiment. FIGS. 8A-9C are cross-sectional views illustrating a method of manufacturing the carbon nanotube sheet according to the present embodiment.

First, the structure of the carbon nanotube sheet according to the present embodiment will be described with reference to FIGS. 6A and 6B. FIGS. 6A and 6B are respectively a plan view and a cross-sectional view illustrating the structure of the carbon nanotube sheet according to the present embodiment.

The carbon nanotube sheet 10 according to the present embodiment includes a plurality of carbon nanotube bundles 12 arranged at a gap between each other (FIG. 6A). In the gaps between the carbon nanotube bundles 12, a carbon nanotube layer (a linear structure layer of carbon atoms) 18 having one ends on the surface of the sheet, a graphite layer 20 formed on the carbon nanotube layer 18 and a filling layer 16 of a resinous material or others are buried (FIGS. 6A and 6B). The graphite layer 20 is thermally and electrically connected to the carbon nanotube bundles 12 and the carbon nanotube layer 20.

In the present specification, the carbon nanotube bundles, the carbon nanotube layer, the graphite layer and the structure of them are often called a carbon structure.

The carbon nanotube bundles 12 are formed extending vertically to the surface of the sheet and each include a plurality of carbon nanotubes oriented vertically to the surface of the sheet.

The carbon nanotubes forming the carbon nanotube bundles 12 may single-walled carbon nanotubes or multi-walled carbon nanotubes. The density of the carbon nanotubes contained in each carbon nanotube bundles 12 is preferably $1 \times 10^{10}$ tubes/cm$^2$ or more in view of the radiation and electric conductivity. The length (the thickness of the sheet) of the carbon nanotube bundles 12 is determined by applications of the carbon nanotube sheet 10 and is not specifically limited. Preferably, the length can be set a value of about 5 μm-500 μm.

In the carbon nanotube sheet 10 according to the present embodiment, gaps are provided between the carbon nanotube bundles 12 over the graphite layer 20, and the filling layer 16 is formed in the gaps. This is for improving the penetration of the filling material when the filling layer 16 is formed between the carbon nanotubes and suppressing configurational changes, such as horizontal falls, etc., of the carbon nanotubes to thereby retain the original orientation of the carbon nanotubes (refer to the first embodiment).

The shape, the layout, etc. of the carbon nanotube bundles 12 are the same as those of the first embodiment.

The carbon nanotube layer 18 is formed extended vertically to the surface of the sheet and a plurality of carbon nanotubes oriented vertically to the surface of the sheet.

The carbon nanotubes forming the carbon nanotube layer 18 may be single-walled carbon nanotubes or multi-walled carbon nanotubes. The density of the carbon nanotubes contained in the carbon nanotube layer 18 is preferably $1 \times 10^{10}$ tubes/cm$^2$ or more in view of the radiation and electric conductivity. The length (the thickness of the sheet) of the carbon nanotube bundles 12 is determined by applications of the carbon nanotube layer 18 and is not specifically limited. Preferably, the length can be set a value of about 5 μm-500 μm.

The graphite layer 20 is formed of graphite of the layer structure parallel with the surface of the sheet and formed in contact with the side surfaces of the carbon nanotube bundles 12 and the upper surface of the carbon nanotube layer 18. The thickness of the graphite layer 20 is, e.g., several nm-tens nm.

The constituent material of the filling layer 16 is the same as that of the first embodiment.

As described above, the carbon nanotube sheet 10 according to the present embodiment includes the carbon nanotube bundles 12 and the carbon nanotube layer 18 oriented vertically to the surface of the sheet, and the graphite layer 20 of graphite of the layer structure parallel with the surface of the sheet. Carbon nanotube has a very high thermal conductivity of about 1500 (W/m·K) in the orientation direction. Graphite does not have so high a thermal conductivity as carbon nanotubes but the thermal conductivity in the direction parallel (a-axis) to the layer surface is 500 (W/m·K), which is very high.

Accordingly, as in the present embodiment, the carbon nanotube sheet 10 includes the combination of the carbon nanotube bundles 12, the carbon nanotube layer 18 and the graphite layer 20, whereby the thermal conductivity in the direction vertical to the surface of the sheet is ensured mainly by carbon nanotubes (the carbon nanotube bundles 12 and the carbon nanotube layer 18), and the thermal conductivity in the direction parallel to the surface of the sheet can be ensured by mainly by graphite (the graphite layer 20).

Graphite has a thermal conductivity 500 times or more that of resinous materials (thermal conductivity: about 1 (W/m·K). By providing the graphite layer 20, the radiation in the direction parallel to the surface of the sheet can be improved drastically by 500 times or more in comparison with that without the graphite layer 20.

A point of the carbon nanotube sheet according to the present embodiment superior to the carbon nanotube sheet according to the first embodiment is that the graphite layer 20 is indirect contact with an exothermic body to be provided below the carbon nanotube sheet with the carbon nanotube layer 18 provided therebetween. That is, in the carbon nanotube sheet according to the present embodiment, radiation is made to the graphite layer 20 once via the carbon nanotube layer 18 is superior in the radiation in the parallel direction to that of the carbon nanotube sheet according to the first embodiment, in which a radiator and the graphite layer 20 are in direct contact with each other, especially when the contact area between the radiator and the sheet is substantially the same as that of the sheet.

Furthermore, the carbon nanotube sheet 20 according to the present embodiment has the upper ends and the lower ends of the carbon nanotube bundles 12 not covered by the filling layer 16. Thus, when the carbon nanotube sheet 20 is brought in contact with a radiator or an exothermic body, the carbon nanotube bundles 12 are contacted with the radiator or the exothermic body, and the thermal conductivity can be drastically increased.

Because of the high electric conductivities of carbon nanotube and graphite, with the upper ends and the lower ends of the carbon nanotube bundles 12 exposed, the carbon nanotube bundles 12 can be also used as interconnections passed through the sheet. The graphite layer 20 can also used as interconnections parallel with the surface of the sheet. That is, the carbon nanotube sheet 10 according to the present embodiment is applicable not only as thermal conduction sheet but also as interconnection sheet.

The height of the carbon nanotube bundles 12 and the thickness of the filling layer 16 (both are lengths in the direction of the thickness of the sheet) is the same as that of the first embodiment.

The carbon nanotube layer 18 and the graphite layer 20 to be formed between the carbon nanotube bundles 12 may be repeatedly stacked as exemplified in FIG. 7. In the example illustrated in FIG. 7, the carbon nanotube layer 18 and the graphite layer 20 are stacked in the 2-layer structure but may be stacked in 3 or more layers.

The graphite layer 20 is provided in plural layers, whereby the substantial film thickness of the graphite layer 20 is increased, and the thermal conductivity and the electric conductivity in the transverse direction can be improved.

Next, the method of manufacturing the carbon nanotube sheet according to the present embodiment will be described with reference to FIGS. 8 and 9.

First, a substrate 30 to be used as the base for forming the carbon nanotube sheet 10 is prepared. As the substrate 30, various substrates described in the first embodiment can be used.

Then, over the substrate 30, a photoresist film (not illustrated) for exposing regions for the carbon nanotube bundles 12 to be formed in is formed by the photolithography. The shape and the layout of the region for the carbon nanotube bundles 12 to be formed in are the same as those of the first embodiment. The regions for the carbon nanotube bundles 12 to be formed in are the circle of, e.g., a 100 µm-diameter, and the gap between the adjacent regions is, e.g., 100 µm.

Then, an Fe film of, e.g., a 2.5 nm-thickness is deposited by, e.g., sputtering method to form a catalytic metal film 32 of Fe film. As the catalytic metal, the same catalytic metal material as in the first embodiment can be used.

Figure 8A:
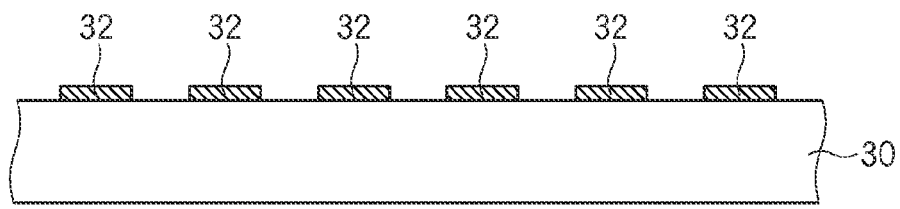
FIGS. 8A-8C and 9A-9C are cross-sectional views illustrating a method of manufacturing the carbon nanotube sheet according to the second embodiment.

Then, the catalytic metal film 32 on the photoresist film is lifted off together with the photoresist film to leave the catalytic metal film 32 selectively in the regions for the carbon nanotube bundles 12 to be formed in. Thus, in the regions for the carbon nanotube bundles 12 to be formed in, the catalytic metal film 32 of Fe film of, e.g., a 2.5 nm-thickness is formed (FIG. 8A).

Then, over the substrate 30, carbon nanotubes are grown by, e.g., hot filament CVD method with the catalytic metal film 32 as the catalyst. The growth conditions for the carbon nanotubes are, e.g., the mixed gas of acetylene and argon (partial pressure ratio of 1:9) as the raw material gas, 1 kPa of the total gas pressure in the film forming chamber, 620° C. temperature and 20 minutes of growth period time. Under these conditions, multi-walled carbon nanotubes of a wall number of 3-6 walls (about 4 walls on the average), a 4-8 nm (6 nm on the average) diameter and a 100 µm-length can be grown. The carbon nanotubes may be formed by another growth method, such as thermal CVD method, remote plasma CVD method or others. The carbon nanotubes to be grown may be single-walled carbon nanotubes. As the carbon raw material, other than acetylene, hydrocarbon, such as methane, ethylene or others, an alcohol, such as ethanol, methanol or others, or others may be used.

Figure 8B:
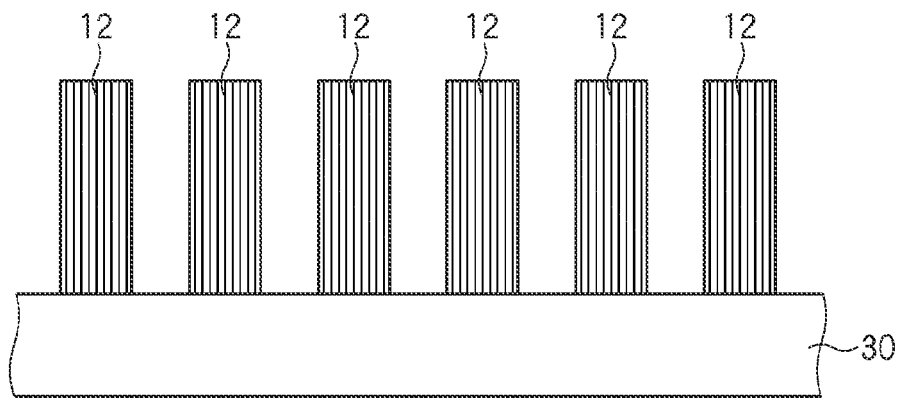

Thus, over the substrate 30 in the regions for the catalytic metal film 32 formed in, carbon nanotube bundles 12 having a plurality of carbon nanotubes oriented in the normal direction of the substrate 30 are selectively formed (FIG. 8B). The carbon nanotube bundles formed under the above-described growth conditions each had an about $1\times10^{11}$ tubes/cm$^2$ carbon nanotube density.

Figure 8C:
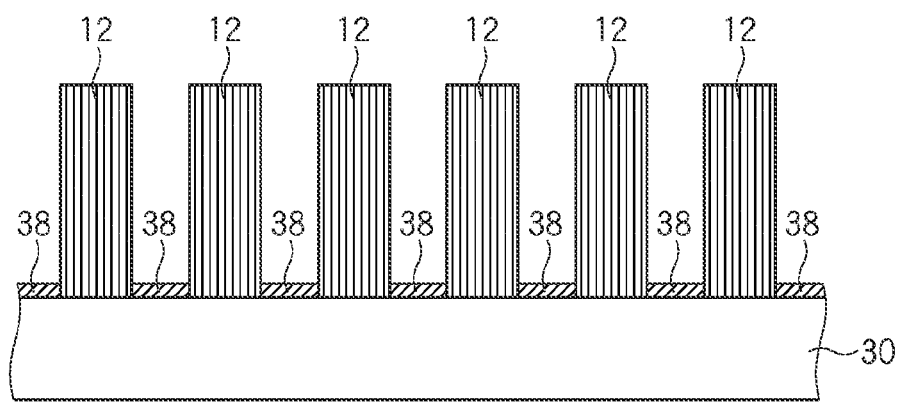

Then, over the substrate 30 with the carbon nanotube bundles 12 formed on, a TiN film of, e.g., a 5 nm-thickness and a Co film of, e.g., a 2.6 nm-thickness are sequentially deposited by, e.g., sputtering method to form a catalytic metal film 38 of the Co/TiN layer structure (FIG. 8C). At this time, because of the upper ends of the carbon nanotube bundles 12, which do not form a continuous flat surface, the catalytic metal film 38 is not formed in a film on the carbon nanotube bundles 12. As the base film of the catalytic metal film 38, other than TiN, another material containing Ti, e.g., Ti (titanium), TiO$_2$ (titanium oxide) or others can be used.

Figure 9A:
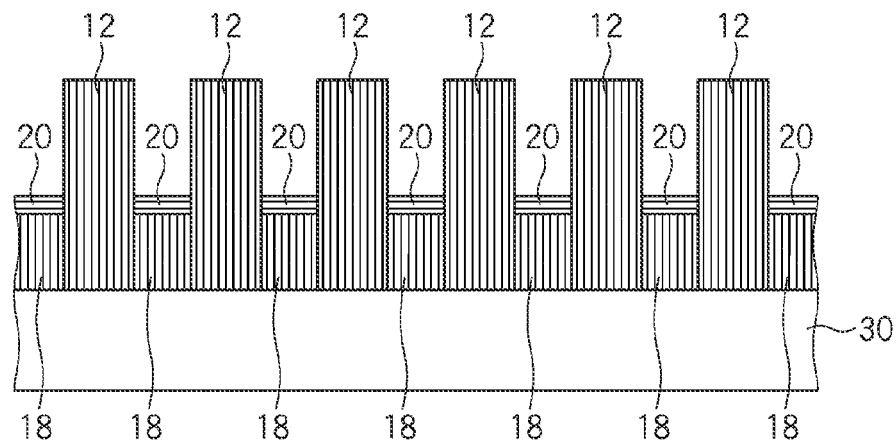

Next, over the substrate 30, by, e.g., thermal CVD method with the catalytic metal film 38 as the catalyst, the carbon nanotube layer 18 having the upper surface coated by the graphite layer 20 is formed (FIG. 9A).

The carbon nanotube layer 18 having the upper surface coated by the graphite layer 20 can be grown by using the raw material gas of hydrocarbon, such as acetylene, methane, ethylene or others at a relatively low temperature of about 450° C.-510° C. For example, the raw material gas is the mixed gas of acetylene and argon (the partial pressure ratio of 1:9), 1 kPa of the total gas pressure in the film forming chamber, 450° C.-510° C. temperature and 30 minutes of growth period of time. Thus, the carbon nanotube layer 18 of multi-walled carbon nanotubes of a wall number of 3-6 walls (about 4 walls on the average), a 4-8 nm diameter (6 nm on the average) and a 20 μm-length can be grown. On the carbon nanotube layer 18, the graphite layer 20 of 18 nm-thickness is formed.

The carbon nanotube layer 18 having the upper surface coated by the graphite layer 20 can be formed by suitably controlling the film thickness of the catalytic metal film 38 (the film thickness of Co film) and the film forming temperature.

Table 1 represents the result of the examined relationships between the film thickness of the Co film of the catalytic metal film 38 and the film forming temperature, and the fabricated structure. The film thickness of the TiN film forming the catalytic metal film 38 was constantly 5 nm.

TABLE 1

| Growth Temperature | Co Film Thickness [nm] | | | | |
|---|---|---|---|---|---|
| [° C.] | 1.2 | 2.1 | 2.6 | 3.6 | 5 |
| 450 | CNT | Graphite/CNT | Graphite/CNT | Graphite/CNT | — |
| 510 | CNT | Graphite/CNT | Graphite/CNT | Graphite/CNT | — |
| 590 | CNT | CNT | CNT | CNT | CNT |

In Table 1, "CNT" indicates the carbon nanotube layer formed of the carbon nanotubes alone, and "Graphite/CNT" indicates the carbon nanotube layer formed of the carbon nanotubes and having the upper surface coated by the graphite layer.

As shown in Table 1, by setting the film thickness of the Co film at 2.1-4.6 nm and the film forming temperature at 450° C.-510° C., the carbon nanotube layer having the upper surface coated by the graphite layer could be formed. The inventors of the present application specifically examined and have found that the carbon nanotube layer having the upper surface coated by the graphite layer can be formed by the growth with the film thickness of the Co film set at 2.0 nm-7.0 nm and the film forming temperature set at 350° C.-560° C.

The thickness of the graphite layer to be formed can be controlled by the film thickness of the Co film and the film forming temperature. When the temperature was 510° C., the graphite layer of a 4 nm-thickness could be formed with the film thickness of the Co film set at 2.1 nm; with the film thickness of the Co film set at 2.6 nm, the graphite layer of a 18 nm-thickness graphite layer could be formed; and with the film thickness of the Co film set at 3.6 nm, the graphite layer of a 30 nm-thickness could be formed. When the film forming temperature was 450° C., the graphite layer of a 20 nm-thickness could be formed with the film thickness of the Co film set at 3.6 nm.

The mechanism of the carbon nanotube layer 18 having the upper surface coated by the graphite layer 20 being formed is not clear, but the inventors of the present application presume as follows.

In the present embodiment, the carbon nanotube layer 18 is grown at a lower temperature than the carbon nanotube bundles 12. Accordingly, at the initial stage of the growth, the Co film of the catalytic metal film is not sufficiently aggregated, and graphite will be grown homogeneously over the catalytic metal film 38. Then, as the Co film aggregates, the growth of the carbon nanotubes will start, and resultantly, the carbon nanotube layer 18 having the upper surface coated by the graphite layer 20 will be formed.

When the carbon nanotube layer 18 having the upper surface coated by the graphite layer 20 is grown, the graphite layer 20 is formed in about 1 second on the initial stage of the growth. The thickness of the carbon nanotube layer 18 (the length of the carbon nanotubes) can be arbitrarily controlled by the growth period of time.

Then, in forming the carbon nanotube sheet of the structure illustrated in FIG. 7, the above-described steps illustrated in FIG. 8C to FIG. 9A are repeated as required to thereby stack the layer body of the carbon nanotube layer 18 and the graphite layer 20 by a prescribed layer number.

The upper surface of the graphite layer 20, which is formed plane, as is not the upper surfaces of the carbon nanotube bundles 12, allows the catalytic meal film 38 to be deposited thereon. Thus, the carbon nanotube layer 18 and the graphite layer 20 can be repeated grown.

Figure 9B:
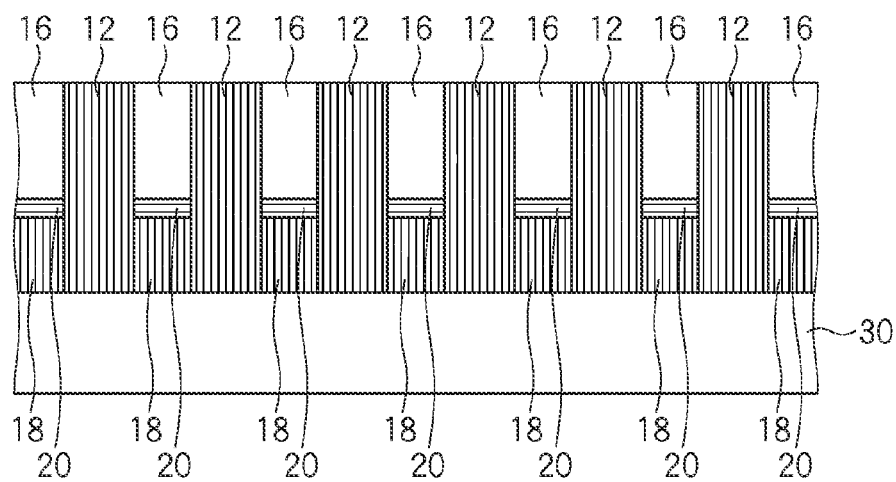

Then, in the same way as in the method of manufacturing the carbon nanotube sheet according to the first embodiment, the filling layer 16 formed buried in the regions between the carbon nanotube bundles 12, between the carbon nanotubes and in the graphite layer (FIG. 9B).

Figure 9C:
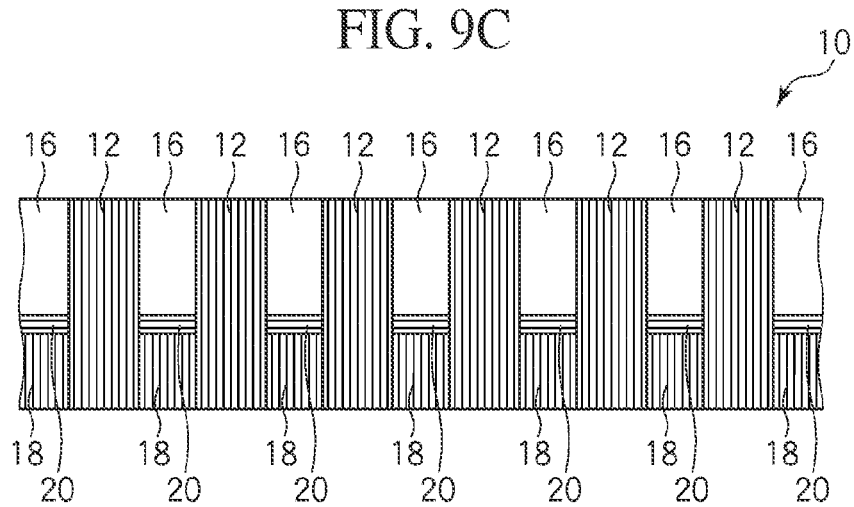

Next, in the same way as in the method of manufacturing the carbon nanotube sheet according to the first embodiment, the carbon nanotube bundles 12, the carbon nanotube layer 18, the graphite layer 20 and the filling layer 16 are peeled from the substrate 30, and the carbon nanotube sheet 10 is obtained (FIG. 9C).

As described above, according to the present embodiment, a plurality of carbon nanotube bundles are formed over the substrate, spaced from each other, and then the filling material is filled to form the filling layer for retaining the carbon nanotube bundles, whereby the configurational changes of the carbon nanotube bundles in forming the filling layer can be prevented. Thus, the carbon nanotube sheet including the carbon nanotube bundles oriented in the direction of the film thickness of the sheet can be easily formed. Both ends of the carbon nanotube bundles can be exposed out of the filling layer, whereby the thermal conductivity and the electric conductivity to a connected body can be improved.

In the gaps between the carbon nanotube bundles, the layer body of the carbon nanotube layer and the graphite layer is formed in contact with the carbon nanotube bundles, whereby the thermal conductivity and the electric conductivity in the direction parallel to the sheet surface can be improved.

A Third Embodiment

A semiconductor device and a method of manufacturing the same according to a third embodiment will be described with reference to FIGS. 10 to 13C.

Figure 10:
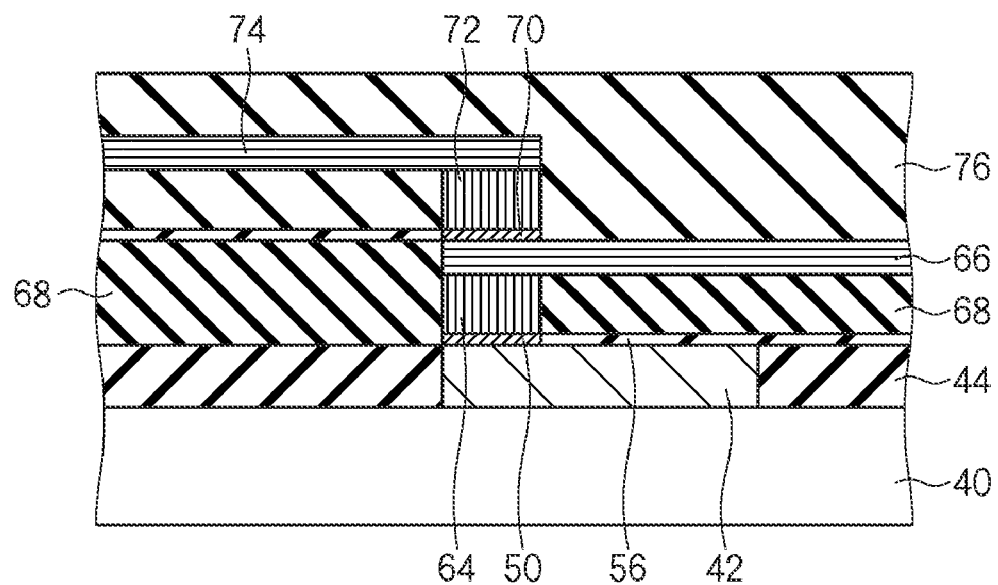
FIG. 10 is a diagrammatic cross-sectional view illustrating a structure of a semiconductor device according to a third embodiment.

FIG. 10 is a diagrammatic cross-sectional view illustrating a structure of a semiconductor device according to the present embodiment. FIGS. 11A-13C are cross-sectional views illustrating a method of manufacturing the semiconductor device according to the present embodiment.

First, the structure of the semiconductor device according to the present embodiment will be described with reference to FIG. 10.

An interconnection layer 42 is formed over a substrate 40. Over the substrate 40 in the region except the region where the interconnection layer 42 is formed, an inter-layer insulating film 44 is formed. Over one end of the interconnection layer 42, a via interconnection 64 of a carbon nanotube bundle is formed with a TiN film 50 interposed therebetween. Over the via interconnection 64, an interconnection layer 66 of graphite is formed in connection with the via interconnection 64. Over the interconnection layer 42 and the inter-layer insulating film 44 in the region where the interconnection layer 66 is formed except the region where the via interconnection 64 is formed, a $TiO_2$ film 56 is formed. Around the via interconnection 64 and the interconnection layer 66, an inter-layer insulating film 68 is formed. Over one end of the interconnection layer 66, a via interconnection 72 of a carbon nanotube bundle is formed with a TiN film 70 interposed therebetween. Over the via interconnection 72, an interconnection layer 74 of graphite is formed in connection with the via interconnection 72. Over the inter-layer insulating film 68 in the region where the interconnection layer 74 is formed except the region where the via interconnection 72 is formed, a $TiO_2$ film is formed. Around the via interconnection 72 and the interconnection layer 74, an inter-layer insulating film 76 is formed.

As described above, in the semiconductor device according to the present embodiment, the via interconnection (e.g., the via interconnection 64) interconnecting the lower interconnection layer (e.g., the interconnection layer 42) and the upper interconnection (e.g., the interconnection layer 66) is formed of the carbon nanotube bundles. The interconnection layer (e.g., the interconnection layer 66) connected to the via interconnection of carbon nanotube bundles (e.g., the via interconnection 64) is formed of the graphite layer.

The interconnection layers and the via interconnections are formed of graphite and carbon nanotubes of low resistance values, whereby the interconnection resistance can be drastically decreased. Thus, the high-speed operation of the semiconductor device is made possible, and the electric power consumption can be decreased.

Next, the method of manufacturing the semiconductor device according to the present embodiment will be described with reference to FIGS. 11 to 13.

Figure 11A:
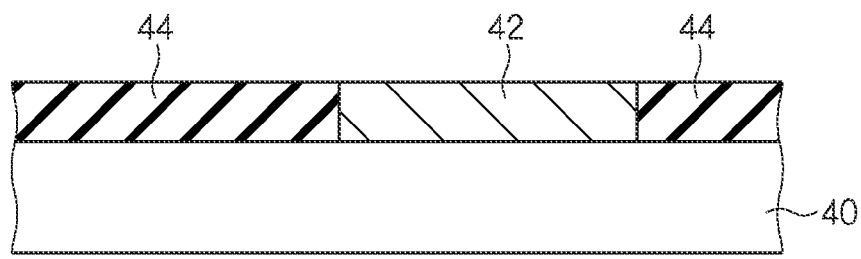
FIGS. 11A-11C, 12A-12C and 13A-13C are cross-sectional views illustrating a method of manufacturing the semiconductor device according to the third embodiment.

Over the substrate 40, the interconnection layer and the inter-layer insulating film 44 have been formed (FIG. 11A). The interconnection layer 42 and the inter-layer insulating film 44 have been formed by the ordinary semiconductor device manufacturing process. The substrate 40 includes not only semiconductor substrates themselves, such as silicon substrates, etc. but also semiconductor substrates with elements, such as transistors, etc., interconnection layers of 1 layer, or or more layers formed on. As the material of the interconnection layer 42, copper, for example, can be used. In this case, over the bottom of the via, tantalum or others for preventing the diffusion of copper is deposited.

Over the substrate 40, a photoresist film 48 exposing the region where the via portion for connecting the upper interconnection layers to the interconnection layer 42 is to be formed and covering the rest region is formed by photolithography.

Figure 11B:
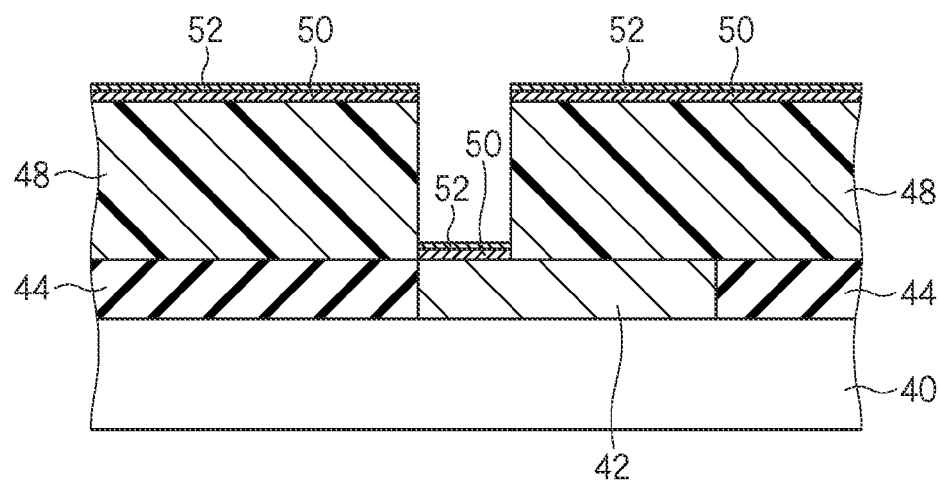

Then, by, e.g., sputtering method, the TiN film of an about 1-20 nm-thickness, e.g., a 5 nm-thickness, and a Co film of an about 2-3 nm-thickness, e.g., a 2.1 nm-thickness are sequentially deposited to form a catalytic metal film of the Co/TiN layer structure (FIG. 11B). The catalytic metal film may be formed by electron beam evaporation method, CVD method, MBE method or others.

In place of selectively forming the catalytic metal film by lift off method as described above, the catalytic metal film may be formed over the entire surface and patterned by photolithography or ion milling. The patterning method can be EB (Electron Beam) exposure or others but is not specifically limited.

Figure 11C:
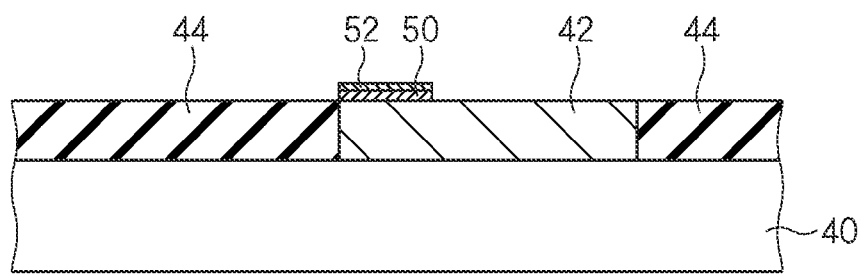

Then, the TiN film 50 and the Co film 52 on the photoresist film 48 are lifted off together with the photoresist film 48 to leave the catalytic metal film of the layer structure of the Co film 52/the TiN film 50 selectively in the region for the via portion to be formed in (FIG. 11C).

Next, by photolithography, a photoresist film 54 exposing the region for the upper interconnection layer to be connected to the interconnection layer 42 is to be formed and which is the region except the region where the via portion where the catalytic metal film of the Co film 52/TiN film 50 is formed, and covering the reset region is formed.

Figure 12A:
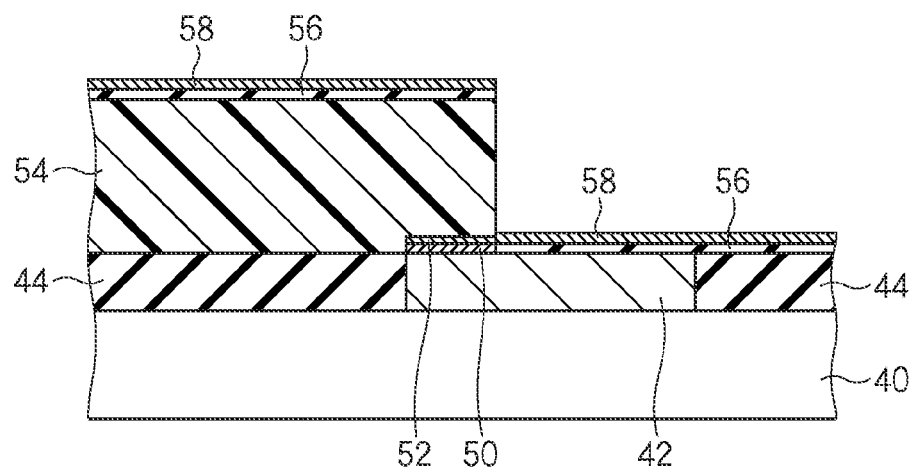

Then, by, e.g., sputtering method, a $TiO_2$ film of an about 1-20 nm-thickness, e.g., a 5 nm-thickness and a Co film of an about 3-7 nm-thickness, e.g., a 4.5 nm-thickness is sequentially deposited to form a catalytic metal film of the Co/$TiO_2$ layer structure (FIG. 12A)

As the base film of the catalytic metal film to be formed in the interconnection layer forming region except the via portion forming region, the $TiO_2$ film 56, which is different from the TiN film 50 used in the via portion forming region because the base film (TiN film 50 and the $TiO_2$ film 56) of the catalytic metal film remain after the interconnection layer has been formed. That is, this is because in the via portion forming region, the TiN film 50, which is electric conductive, is used so as to ensure the electric connection with the base interconnection layer 42, but if an electric conductive film, such as TiN film, is formed also in the interconnection layer forming region except the via portion forming region, there is a risk of short circuits with other interconnection layers via the TiN film 50. From such view point, it is preferable that in the interconnection layer forming region except the via portion forming region, an insulative base film of $TiO_2$ film or others is formed. When there is no risk of short circuits between the interconnection layers, an electric conductive base film may be used, as is in the via portion forming region.

Figure 12B:
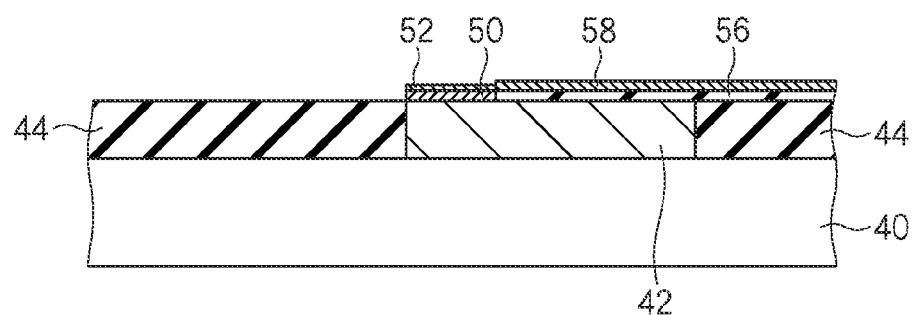

Then, the $TiO_2$ film 56 and the Co film 58 on the photoresist film 54 are lifted off together with the photoresist film 54 to leave the catalytic metal film of the layer structure of the Co film 58/the $TiO_2$ film 56 selectively in the interconnection layer forming region except the via portion forming region (FIG. 12B).

Figure 12C:
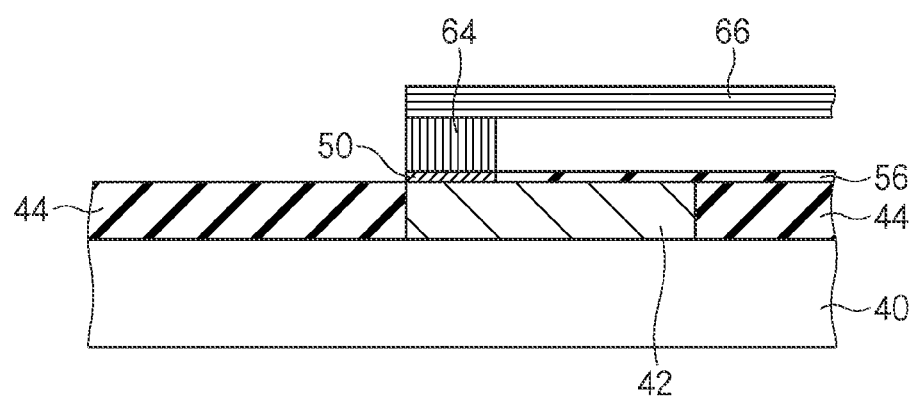

Next, by, e.g., thermal CVD method, with the catalytic metal film as the catalyst, the carbon nanotubes and the graphite are grown. The growth conditions for this are, e.g., the mixed gas of acetylene and argon (the partial pressure ratio of 1:9) as the raw material gas, 1 kPa of the total gas pressure in the film forming chamber and 450° C. temperature, whereby in the via portion forming region, where the catalytic film of the Co film 52/the TiN film 50 is formed, the via interconnection 64 of the carbon nanotube bundle is formed, and in the interconnection layer forming region, where the Co film 58/the $TiO_2$ film 56 is formed, the interconnection layer 66 of the graphite layer extended over the via interconnection 64 is formed, spaced from the $TiO_2$ film 56 (FIG. 12C). The carbon nanotubes and the graphite may be formed by hot filament CVD method, remote plasma CVD method or others.

The Co films 52, 58 are formed into particulates in the process of growing the carbon nanotubes and the graphite and taken into the carbon nanotubes or the graphite.

The structures formed respectively over the catalytic metal film of the Co film 52/TiN film 50 and over the catalytic metal film of the Co film 58/the $TiO_2$ film 56 are different from each other under the influence of the different growth rates due to the film thickness difference between the Co films.

The conditions for the growth with the Co film of a 2.1 nm-thickness and a 4.5 nm-thickness as the catalyst at the above film forming temperature are the conditions for growing the carbon nanotubes having the upper surfaces coated by the graphite layer, as described in the second embodiment. However, the growth rate of the carbon nanotubes in the region where the 4.5 nm-thickness Co film is formed is much lower than the growth rate of the carbon nanotubes in the region where the 2.1 nm-thickness Co film is formed, and after the interconnection layer 66 of the graphite layer has been formed, the growth of the carbon nanotubes over the catalytic metal film of the Co film 52/TiN film 50 is dominant. Resultantly, as the carbon nanotubes grow onto the catalytic metal film of the Co film 52/the TiN film 50, the entire graphite layer in the interconnection layer forming region is lifted, and the carbon nanotubes do not grow onto the catalytic film of the Co film 58/the $TiO_2$ film 56. Resultantly, the via interconnection 64 and the interconnection layer 66 as illustrated in FIG. 12C are formed.

Table 2 represents the lengths of the carbon nanotubes formed when the Co film thickness and the growing conditions of the carbon nanotubes are varied.

TABLE 2

| Co Film Thickness | Growth Conditions | |
|---|---|---|
| [nm] | 450° C. 60 min | 510° C. 10 min |
| 2.1 | — | 7.0 μm |
| 2.6 | 0.8 μm | 5.0 μm |
| 3.6 | 0.6 μm | 3.0 μm |
| 4.5 | 0.3 μm | 0.4 μm |

As shown in Table 2, the growth rate of the carbon nanotubes lowers at all the growth temperatures as the film thickness of the Co film is thicker. Accordingly, the film thickness of the Co film to be deposited in the via interconnection forming region and the interconnection layer forming region are suitably set, whereby the via interconnection of the carbon nanotube bundle and the interconnection layer of the graphite layer can be simultaneously formed.

Figure 13A:
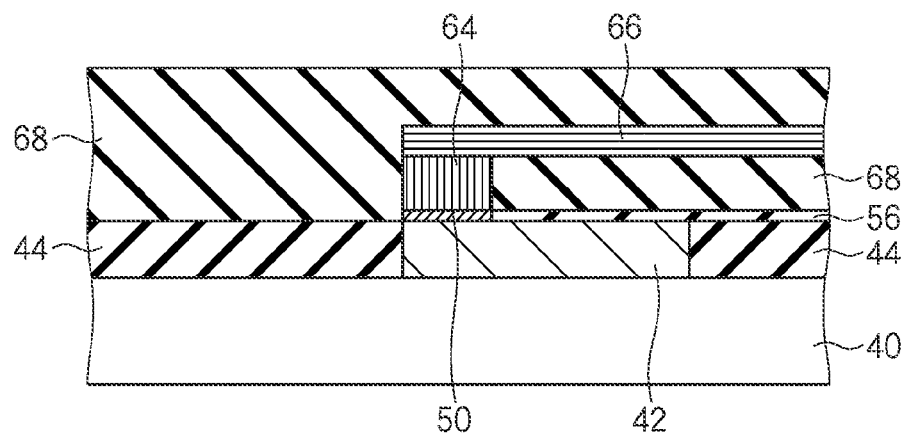

Next, over the substrate 40 with the interconnection layer 66 formed, the inter-layer insulating film 68 coating the interconnection layer 66 is formed by e.g., spin coating method or CVD method (FIG. 13A).

Figure 13B:
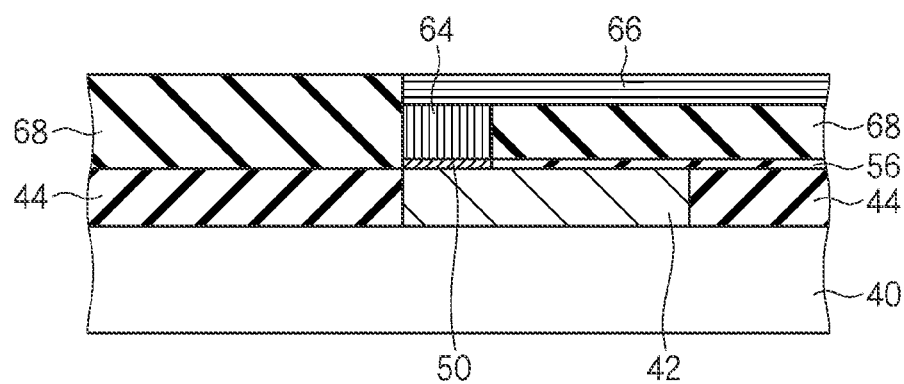
Figure 13C:
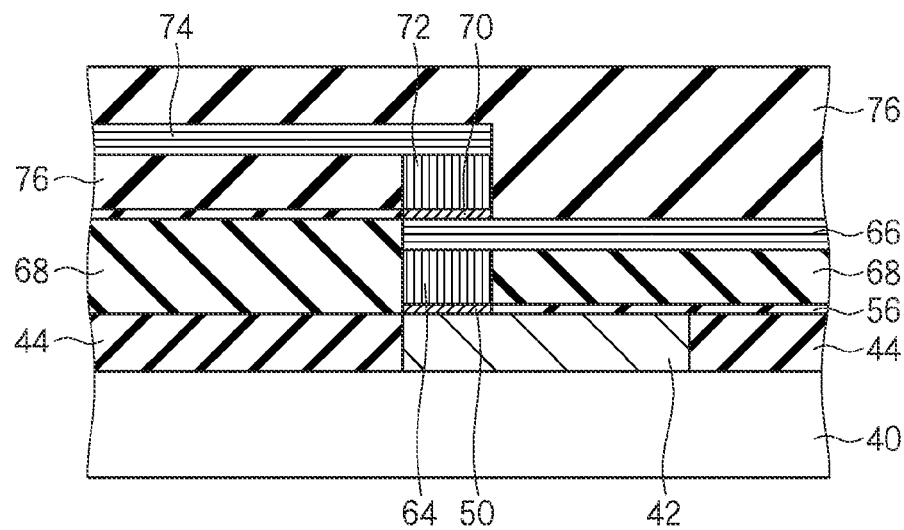

Then, the surface of the inter-layer insulating film 68 is polished by, e.g., CMP method until the surface of the interconnection layer 66 is exposed (FIG. 13B).

Next, the steps illustrated in FIG. 11B to FIG. 13A are repeated as required to thereby form over the interconnection layer 66, a via interconnection 72 electrically connected to the interconnection layer 66 via a TiN film 70, an interconnection layer 74, an inter-layer insulating film 76, etc. (FIG. 13C).

As described above, according to the present embodiment, the via interconnection formed of the carbon nanotube bundle, and the interconnection layer formed of the graphite layer connected to the via interconnection can be formed, whereby the electric resistance of the via interconnection and the interconnection layer can be drastically decreased, and the characteristics of the semiconductor device can be improved. The via interconnection of the carbon nanotube bundle and the interconnection layer of the graphite layer can be simultaneously formed, whereby an interconnection structure can be formed without largely changing manufacturing steps, and the manufacturing cost increase can be prevented.

A Fourth Embodiment

A semiconductor device and a method of manufacturing the same according to a fourth embodiment will be described with reference to FIGS. 14 to 17C.

Figure 14:
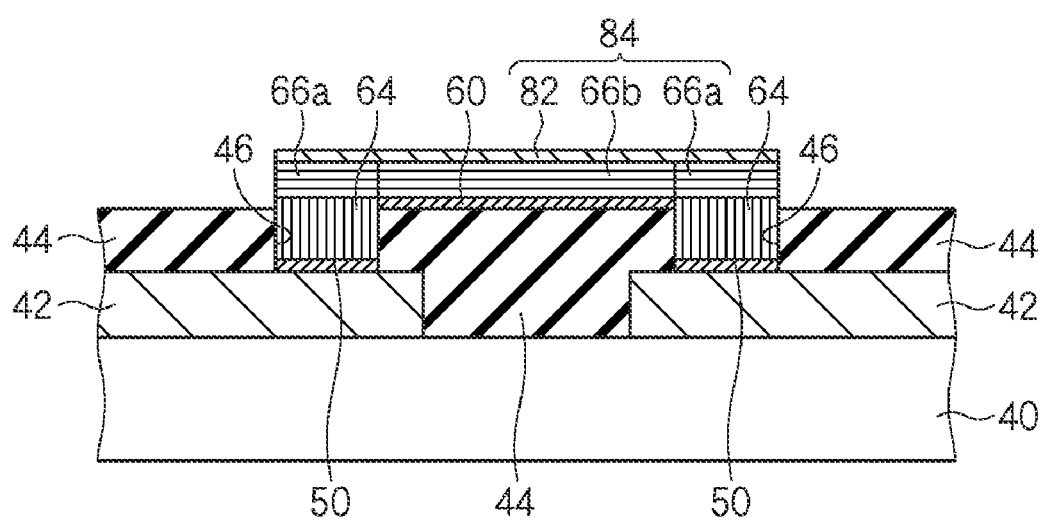
FIG. 14 is a diagrammatic cross-sectional view illustrating a structure of a semiconductor device according to a fourth embodiment.

FIG. 14 is a diagrammatic cross-sectional view illustrating a structure of a semiconductor device according to the present embodiment. FIGS. 15A-17C are cross-sectional views illustrating a method of manufacturing the semiconductor device according to the present embodiment.

First, the structure of the semiconductor device according to the present embodiment will be described with reference to FIG. 14.

An interconnection layer 42 is formed over a substrate 40. Over the substrate 40 with the interconnection layer 42 formed, an inter-layer insulating film 44 is formed. In the inter-layer insulating film 44, contact holes 46 down to the interconnection layer 42 are formed. Over the interconnection layer 42 in the contact holes 46, via interconnections 64 of carbon nanotube bundles are formed with a TiN film interposed therebetween. Over the via interconnections 64, an interconnection layer 84 connected to the via interconnections 64 is formed. The interconnection layer 84 includes a graphite layer 66a formed over the via interconnections 64, a graphite layer 66b formed over the inter-layer insulating film with a TiN film 66 interposed therebetween and a TiC film 82 formed over the graphite layers 66a, 66b.

As described above, in the semiconductor device according to the present embodiment, the via interconnection (e.g., the via interconnections 64) interconnecting a lower interconnection (e.g., the interconnection layer 42) and an upper interconnection (e.g., the interconnection layer 84) is formed of carbon nanotube bundles. An interconnection layer (e.g., the interconnection layer 84) connected to the via interconnection (e.g., the interconnections 64) formed of carbon nanotube bundles is formed of the graphite layers 66a, 66b and the TiC film 82.

The interconnection layer and the via interconnections are formed of graphite and carbon nanotube whose resistance value are low, whereby the interconnection resistance can be drastically decreased. This makes the high-speed operation of the semiconductor device possible, and the electric power consumption can be decreased.

The TiC film formed on the graphite layers 66a, 66b ensures the electric connection between the graphite layers 66a, 66b. The TiC film 82 is formed in consideration that the graphite layer 66a and the graphite layer 66b are grown independently from different bases and, although formed in the adjacent regions, might not ensure sufficient electric connection. If the electric connection between the graphite layer 66a and the graphite layer 66b is sufficient, the TiC film 82 may not be essentially formed.

Next, the method of manufacturing the semiconductor device according to the present embodiment will be described with reference to FIGS. 15 to 17.

Figure 15A:
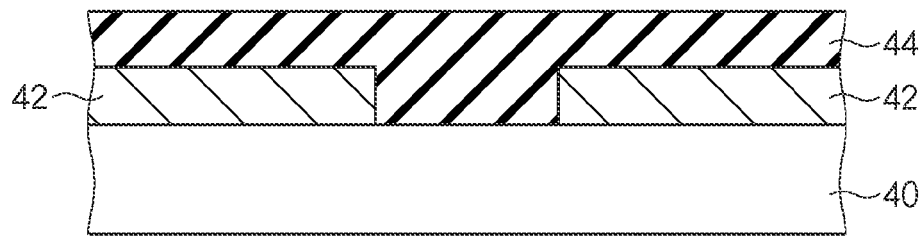
FIGS. 15A-15C, 16A-16C and 17A-17C are cross-sectional views illustrating a method of manufacturing the semiconductor device according to the fourth embodiment.

The interconnection layer 42, and the inter-layer insulating film 44 coating the interconnection layer 42 are formed over the substrate 40 (FIG. 15A). The substrate 40 includes not only semiconductor substrates themselves, such as silicon substrates or others, but also substrates with elements, such as transistors, etc., interconnection layers of 1 layer, or 2 or more layers formed on.

Figure 15B:
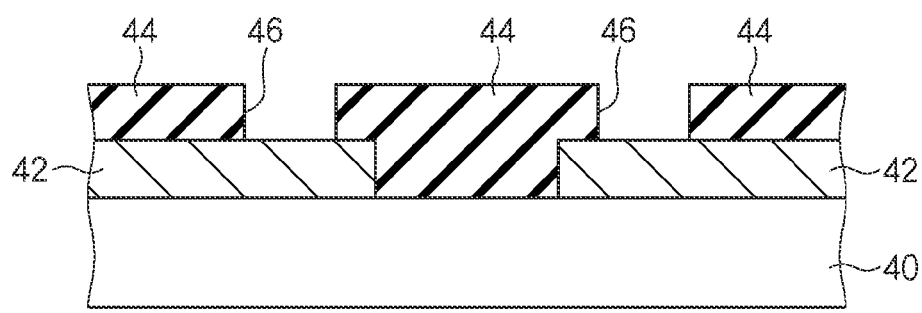
Figure 15C:
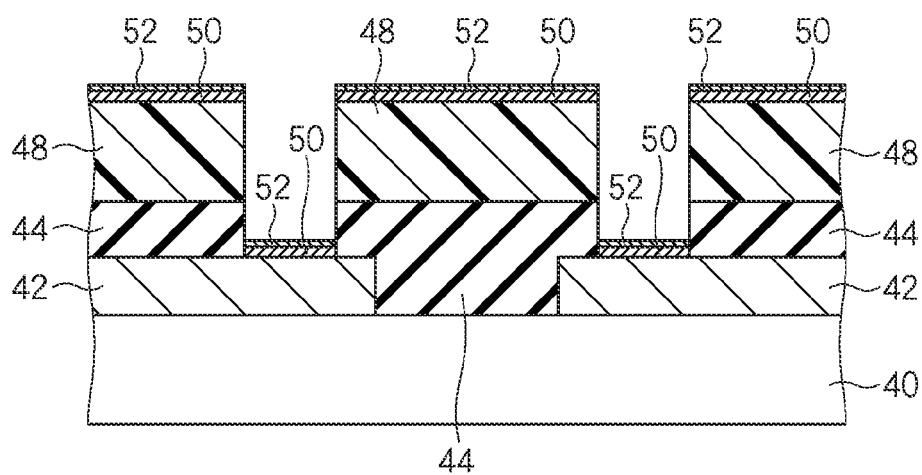

Next, by photolithography and dry etching, in the inter-layer insulating film 44, the contact holes 46 down to the interconnection layer 42 are formed (FIG. 15B).

Next, by photolithography, over the inter-layer insulating film 44, a photoresist film 48 exposing the regions where the contact holes 46 are to be formed and coating the rest region is formed. As the photoresist film 48, the photoresist film used in forming the contact holes 46 may be used.

Then, by, e.g., sputtering method, the TiN film of an about 1-20 nm-thickness, e.g., a 5 nm-thickness and a Co film 52 of an about 2-3 nm-thickness, e.g., a 2.6 nm-thickness are sequentially deposited to form a catalytic metal film of the layer structure of Co/TiN (FIG. 11C). The catalytic metal film may be formed by electron beam evaporation method, CVD method, MBE method or others.

Figure 16A:
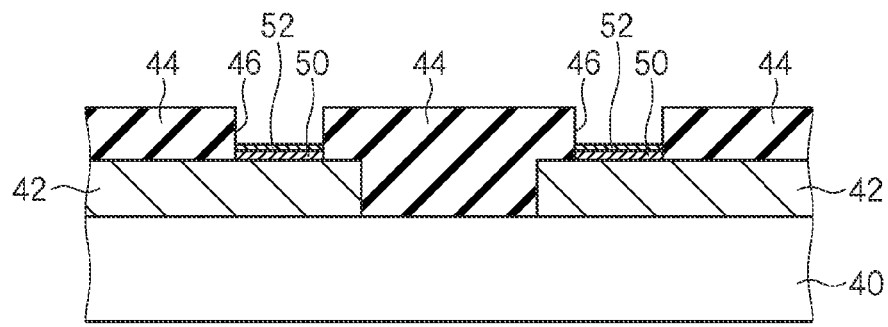

Then, the TiN film 50 and the Co film 52 on the photoresist film 48 are lifted off together with the photoresist film 48 to leave the catalytic metal film of the layer structure of the Co film 52/the TiN film 50 selectively on the interconnection layer 42 in the contact holes 46 (FIG. 16A).

Next, by photolithography, a photoresist film 54 exposing the region where the upper interconnection layer to be connected to the interconnection layer 42 is to be formed and which is the region except the region where the contact holes 46 are formed, and covering the rest region is formed.

Figure 16B:
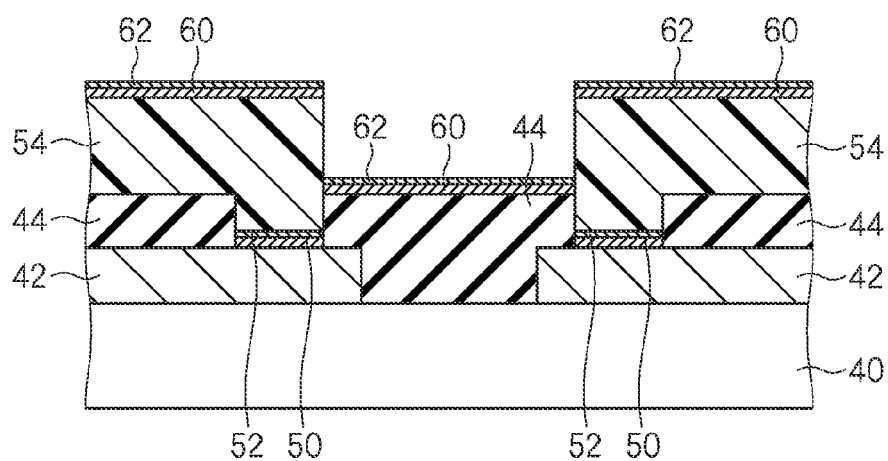

Next, by, e.g., sputtering method, the TiN film of an about 1-20 nm-thickness, e.g., a 5 nm-thickness, and the Co film 62 of an about 3-7 nm-thickness, e.g., a 4.5 nm-thickness are sequentially deposited to form the catalytic metal film of the layer structure of Co/TiN (FIG. 16B).

Figure 16C:
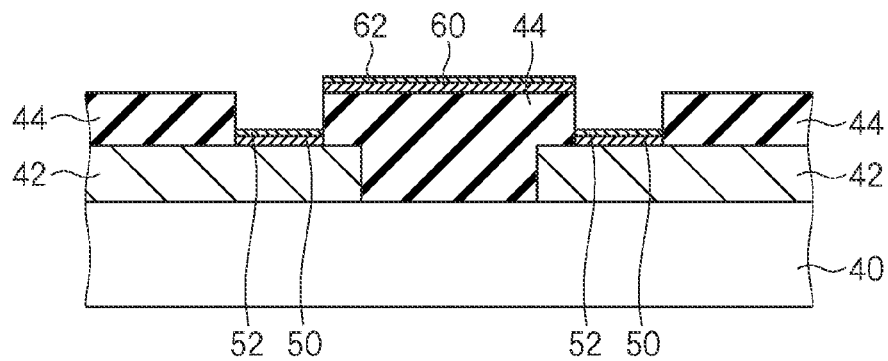

Then, the TiN film 60 and the Co film 62 on the photoresist film 54 are lifted off together with the photoresist film 54 to leave the catalytic metal film of the layer structure of the Co film 62/the TiN film 60 selectively in the region where the interconnection layer is to be formed and which is the region except the region where the contact holes 46 are formed (FIG. 16C).

Figure 17A:
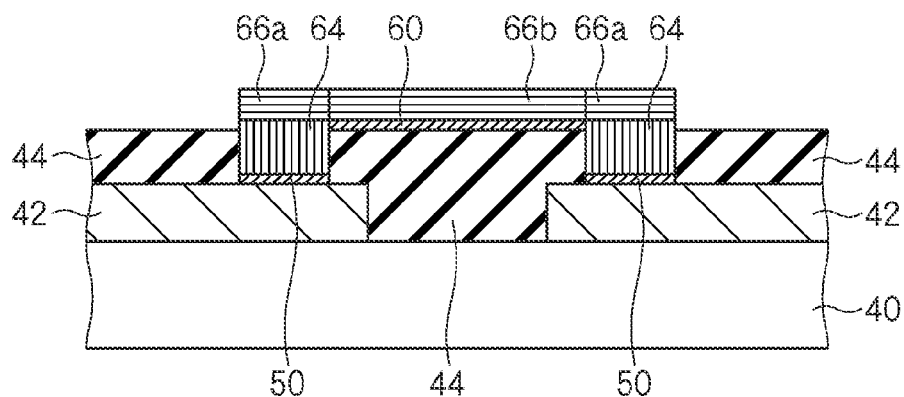

Next, by, e.g., thermal CVD method, with the catalytic metal film as the catalyst, carbon nanotubes and graphite are grown. The conditions for this growth are set at, e.g., the mixed gas of acetylene and argon gas (partial pressure ratio of 1:9) as the raw material gas, 1 kPa of the total gas pressure in the film forming chamber and 450° C. temperature, whereby the via interconnections 64 of carbon nanotube bundles having the upper surfaces coated by the graphite layer 66a in the via portion forming region, where the Co film 52/the TiN film 50 is formed, and the graphite layer 66b in the interconnection layer forming region, where the Co film 62/the TiN film 60 is formed (FIG. 17A). The carbon nanotubes and the graphite may be formed by hot filament CVD method, remote plasma CVD method or others.

The Co films 52, 62 are formed into particulates in the process of growing the graphite and are taken into the carbon nanotubes or the graphite.

The structures formed respectively on the catalytic metal film of the Co film 52/the TiN film 50 and on the catalytic metal film of the Co film 62/the TiN film 60 are different from each other, and this is influenced by the difference of the growth rate due to the difference of the film thickness of the Co films.

The conditions for the growth with the 2.6 nm-thickness Co film and the 4.5 nm-thickness Co film at the above-described film forming temperature are both the conditions for the carbon nanotubes having the upper surfaces coated by the graphite layer, as described in the second embodiment. However, the growth rate of the carbon nanotubes in the regions with the 4.5 nm-thickness Co film formed in is much lower than the growth rate of the carbon nanotubes in the region with the 2.6 nm-thickness Co film formed in, whereby the via interconnection 64 of carbon nanotube bundles are being formed below the graphite layer 66a, the carbon nanotube bundles are not substantially grown below the graphite layer 66b. Resultantly, the via interconnection 64 and the graphite layer 66a, 66b as illustrated in FIG. 17A are formed.

Next, by photolithography, a photoresist film 78 exposing the interconnection layer forming region (the region where the graphite layers 66a, 66b are formed) and covering the reset region is formed.

Figure 17B:
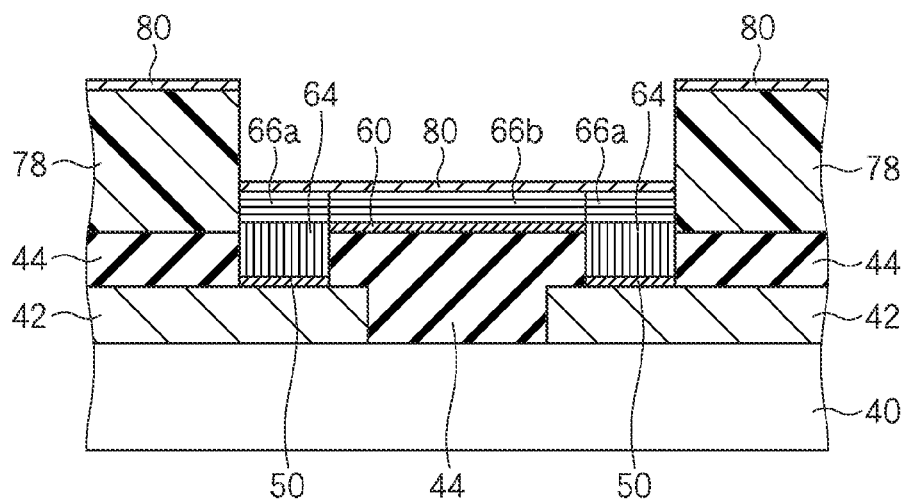

Next, a Ti film 80 of, e.g., a 50 nm-thickness is deposited by, e.g., sputtering method (FIG. 17B).

Next, the Ti film 80 on the photoresist film 78 is lifted off together with the photoresist film 78 to leave the Ti film 80 selectively on the graphite layers 66a, 66b in the interconnection layer forming region.

Figure 17C:
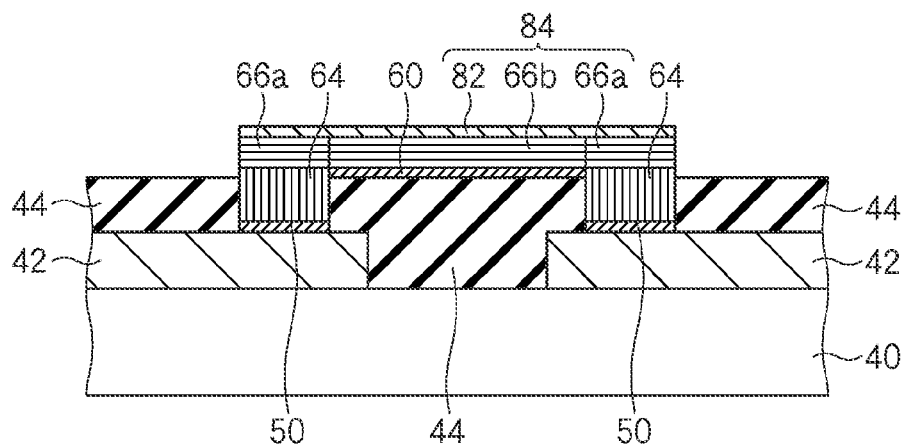

Then, thermal processing of, e.g., 450° C. and 10 minutes is made to react the Ti film 80 with the upper parts of the graphite layers 66a, 66b to form a TiC (titanium carbide) film 82 on the surfaces of the graphite layers 66a, 66b. TiC can be formed by only deposition by sputtering method, but this thermal processing advances the formation of TiC. Thus, the interconnection layer 84 of the graphite layers 66a, 66b and the TiC film 82 is formed (FIG. 17C).

As described above, according to the present embodiment, the via interconnection of the carbon nanotube bundles, and the interconnection layer of the graphite layer connected to the via interconnection can be formed, whereby the electric resistance of the via interconnection and the interconnection layer can be drastically decreased, and the characteristics of the semiconductor device can be improved. The via interconnection of the carbon nanotube bundles and the interconnection layer of the graphite layer can be simultaneously formed, whereby the interconnection structure can be formed without largely changing the manufacturing steps. This can prevent the manufacturing cost increase.

A Fifth Embodiment

An electronic device according to a fifth embodiment will be described with reference to FIG. 18.

Figure 18:
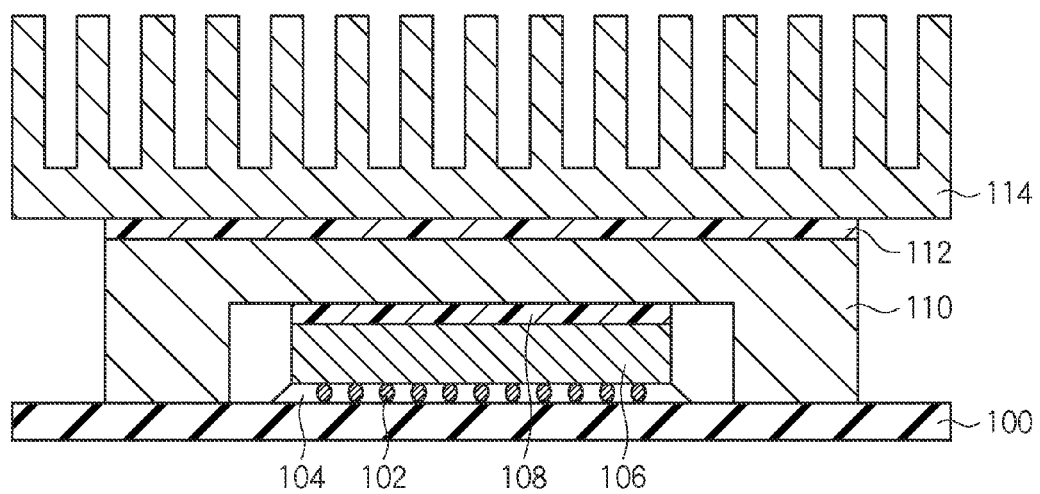
FIG. 18 is a diagrammatic cross-sectional view illustrating a structure of an electronic device according to a fifth embodiment.

FIG. 18 is a diagrammatic cross-sectional view illustrating the structure of the electronic device according to the present embodiment.

In the present embodiment, the electronic device using the carbon nanotube sheet according to the first or the second embodiment as the thermal conductive sheet will be described.

Over a circuit board 100, such as a multi-level interconnection substrate or others, a semiconductor element 106, e.g., a CPU, etc. are mounted. The semiconductor element 106 is electrically connected to the circuit board 100 via solder bumps 102, and an under fill 104 is filled between the circuit board 100 and the semiconductor element 106.

Over the semiconductor element 106, a heat spreader 110 for diffusing the heat from the semiconductor element 106 is formed covering the semiconductor element 106. Between the semiconductor element 106 and the heat spreader 110, the carbon nanotube sheet 108 according to the first or the second embodiment is formed. The carbon nanotube sheet 108 is arranged with the graphite layer 14 or the carbon nanotube layer 18 positioned on the side of the semiconductor element 106, which is the exothermic source (refer to FIGS. 1 and 6).

Over the heat spreader 110, a heat sink 114 for radiating the heat conducted to the heat spreader 110 is formed. Between the heat spreader 110 and the heat sink 114, the carbon nanotube sheet 112 according to the the first or the second embodiment is formed.

As described above, in the electronic device according to the present embodiment, between the semiconductor element 106 and the heat spreader 110 and between the heat spreader 110 and the heat sink 114, i.e., the exothermic units and the radiation units, the carbon nanotube sheets 106, 112 according to the first or the second embodiment is respectively provided.

As described above, the carbon nanotube sheet according to the first or the second embodiment includes the carbon nanotube bundles 12 oriented vertical of the surface of the sheet, and the graphite layer 14 of graphite in the layer structure parallel with the film surface of the sheet, and has very high thermal conductivity in the directions normal and parallel to the surface.

Thus, the carbon nanotube sheet according to the first or the second embodiment is used as the thermal conductive sheets formed between the semiconductor element 106 and the heat spreader 110 and between the heat spreader 110 and the heat sink 114, whereby the heat emitted from the semiconductor element 106 can be conducted vertically to the heat spreader 110 and the heat sink 114 while efficiently spreading horizontally, and the radiation efficiency can be raised. Thus, the reliability of the electronic device can be improved.

As described above, according to the present embodiment, between the semiconductor element and the heat spreader and between the heat spreader and the heat sink, the carbon nanotube sheet according to the first or the second embodiment, which includes carbon nanotube bundles oriented vertically to the film surface of the sheet, and the graphite layer of graphite of the layer structure parallel to the film surface of the sheet, whereby the thermal conductivities between them can be drastically improved. Thus, the radiation efficiency for the heat emitted from the semiconductor device can be raised, and the reliability of the electronic device can be improved.

A Sixth Embodiment

An electronic device according to a sixth embodiment will be described with reference to FIG. 19.

Figure 19:
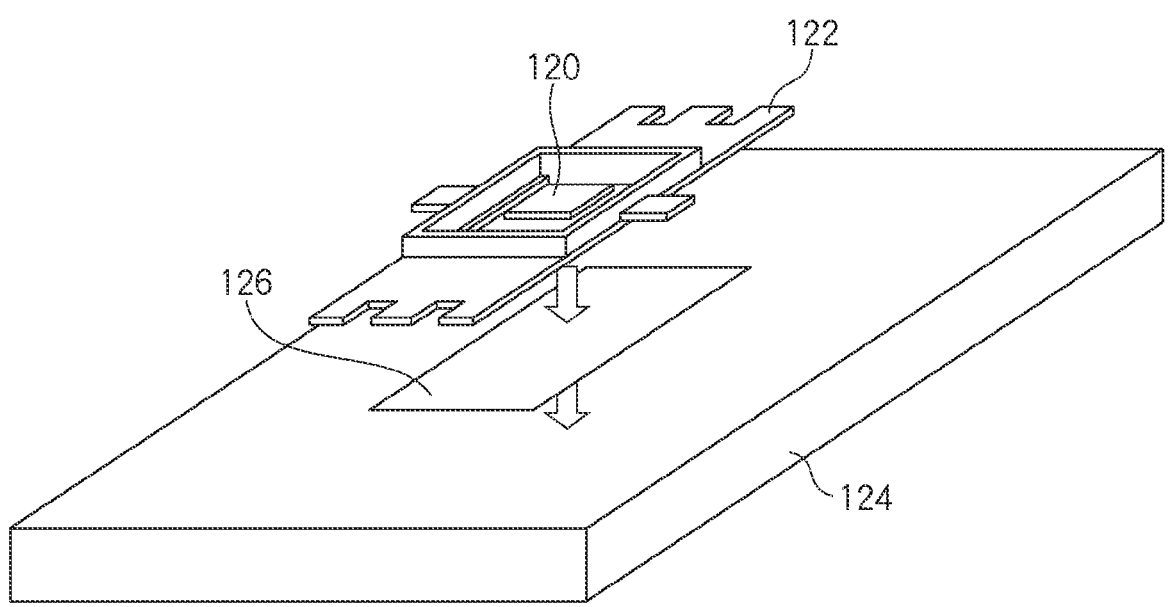
FIG. 19 is a perspective view illustrating a structure of an electronic device according to a sixth embodiment.

FIG. 19 is a perspective view illustrating the structure of the electronic device according to the present embodiment.

In the present embodiment, the electronic device using the carbon nanotube sheet according to the first or the second embodiments as a thermal conductive sheet which functions also as an electric conductive sheet will be described.

As illustrated in FIG. 19, an HPA (High Power Amplifier) 120 used in radio communication stations, etc. is incorporated in a package 122, and a heat sink 124 is jointed to the underside of the package 122. The heat generated from the HPA 120 is radiated to the heat sink 124 through the underside of the package 122. The package 122 is also used as the electric ground (ground surface) and is connected also electrically to the heat sink 124. To this end, for the junction between the package 122 and the heat sink 124, good conductor for electricity and heat is used.

As illustrated in FIG. 19, the carbon nanotube sheet 126 according to the first or the second embodiment is used at the junction between the package 122 and the heat sink 124, whereby the package 122 and the heat sink 124 can be electrically connected to each other. Also, the heat generated from the HPA 120 can be efficiently conducted to the heat sink 124, and the radiation efficiency can be improved. Thus, the reliability of the electronic device can be improved.

As described above, according to the present embodiment, between the package of the HPA and the heat sink, the carbon nanotube sheet according to the first or the second embodiment, including the carbon nanotube bundles oriented vertically to the film surface of the sheet, and the graphite layer of graphite of the layer structure parallel with the film surface of the sheet formed between the carbon nanotube bundles is arranged, whereby the thermal conductivity between them can be drastically improved. Thus, the radiation efficiency for the heat emitted from the semiconductor element can be improved, and the reliability of the electronic device can be improved. Also, the high power amplifier and the heat sink as the ground can be electrically connected to each other.

Modified Embodiments

Embodiments have been explained above, but the conditions and constitutions of the respective embodiments are not essential. The embodiments can cover other various modifications.

For example, in the above-described embodiments, examples of the sheet structures and the semiconductor device using carbon nanotube were described, but the embodiments are applicable widely to sheet structures and semiconductor devices using linear structures of carbon atoms. The linear structures using carbon atoms can be, other than carbon nanotube, carbon nanowire, carbon rod, carbon fiber. These linear structures are different from carbon nanotube in the size but are the same in other respects. The embodiments are applicable to sheet structures and semiconductor devices using such linear structures.

The constituent materials and the manufacturing conditions described in the above-described embodiments are not limited to those described above and can varied suitably to ends, etc.

The uses of the carbon nanotube sheet are not limited to those described in the embodiments described above. The described carbon nanotube sheet is applicable, as the heat conductive sheet, to, e.g., the heat radiation sheet of CPUs, high power amplifiers of radio communication stations, high power amplifiers for radio communication terminals, high power switches for electric motors, servers, personal computers, etc. By utilizing the high allowable current density of the carbon nanotubes, the carbon nanotube sheet can be applicable to vertical interconnecting sheets and various applications using the vertical interconnection sheets.

In the above-described embodiments, as the catalytic metal film having the base film, the layer structures of Co film/TiN film and Co film/$TiO_2$ film are described, but the catalytic metal film is not limited to them. For example, when a hydrocarbon-based raw material gas is used, with Co, Ni or Fe as the catalyst species, Ti, TiN, $TiO_x$, TiSi, Ta, TaN, Zr, Hf, V, Nb, W or others can be used as the base film. When Fe is used as the catalyst species, Al or $Al_2O_3$ can be also used as the base film. When an alcohol-based raw material gas is used, with Co used as the catalyst species, Mo or others can be used as the base film.

The structures and the semiconductor device described in the third and the fourth embodiments, and the electronic devices described in the fifth and the six embodiments, and their manufacturing methods are described as the typical examples and can be suitably modified as required.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of growing a carbon structure comprising:
    forming a first catalytic metal film over a substrate in a first region;

forming a second catalytic metal film different from the first catalytic metal film over the substrate in a second region adjacent to the first region;

forming selectively in the first region a first carbon structure including a plurality of linear structures of carbon atoms with the first catalytic metal film as a catalyst; and forming selectively in the second region a second carbon structure including a graphite layer with the second catalytic metal film as a catalyst.

2. The method of growing a carbon structure growing method according to claim 1, wherein forming the first carbon structure and forming the second carbon structure are made simultaneously.

3. The method of growing a carbon structure according to claim 2, wherein in forming the first catalytic metal film, the first catalytic metal film including a 0.3-10 nm-thickness Fe film is formed, and in forming the second catalytic metal film, the second catalytic metal film including a 10-1000 nm-thickness Fe film is formed.

4. The method of growing a carbon structure according to claim 1, wherein forming the second catalytic metal film is made after forming the first carbon structure and before forming the second carbon structure.

5. The method of growing a carbon structure according to claim 4, wherein in forming the second carbon structure, the second carbon structure including the graphite layer formed on an upper surface of a plurality of linear structure layer of carbon atoms is formed.

6. The method of growing a carbon structure according to claim 5, wherein after forming the first carbon structure, forming the second catalytic metal film and forming the second carbon structure are repeated to form a layer structure of the second carbon structures in the second region.

7. The method of growing a carbon structure according to claim 4, wherein in forming the first catalytic metal film, the first catalytic metal film of a 0.3-10 nm-thickness Fe film is formed, and in forming the second catalytic metal film, the second catalytic metal film of a 2.0-7.0 nm-thickness Co film is formed.

8. The method of growing a carbon structure according to claim 4, wherein in forming the second carbon structure, the second carbon structure is formed at 350-560° C.

9. A method of manufacturing a sheet structure comprising:

forming over the substrate the first carbon structure and the second carbon structure by the method of growing the carbon structure according to claim 1;

filling a filling material in the first carbon structure and the second carbon structure to form a filling layer of the filling material.

10. A method of manufacturing a semiconductor device comprising:

forming over the substrate in the first region a first carbon structure including a plurality of linear structures of carbon atoms and a first graphite layer formed on the linear structures with the first catalytic metal film as the catalyst, and simultaneously forming over the substrate in the second region a second carbon structure including a second graphite layer with the second catalytic metal film as a catalyst by the method of growing the carbon structure according to claim 9, wherein a via interconnection formed of the plurality of linear structures, and an interconnection layer including the first graphite layer and the second graphite layer are formed.

11. The method of manufacturing a semiconductor device according to claim 10, wherein in forming the first carbon structure and the second carbon structure, the first carbon structure and the second carbon structure are formed discriminate from each other by utilizing a difference between a growth rate of the linear structure of carbon atoms on the first catalytic metal film and a growth rate of the linear structure of carbon atoms on the second catalytic metal film.

12. The method of manufacturing a semiconductor device according to claim 10, wherein in forming the first catalytic metal film, the first catalytic metal film including a first Co film of a 2.0-7.0 nm-thickness is formed, and in forming a second catalytic metal film, the second catalytic metal film including a second Co film of a 2.0-7.0 nm-thickness and thicker than the first Co film is formed.

* * * * *